United States Patent
Seki et al.

(10) Patent No.: US 8,926,156 B2
(45) Date of Patent: Jan. 6, 2015

(54) LIGHT-EMITTING DEVICE AND ILLUMINATION DEVICE

(75) Inventors: Akinobu Seki, Saitama (JP); Hiroshi Takatori, Saitama (JP); Kyouhei Yamada, Saitama (JP); Masato Nakamura, Saitama (JP); Masayo Takizawa, Saitama (JP); Noriyuki Kawahara, Saitama (JP)

(73) Assignee: Enplas Corporation, Saitama (JP)

(*) Notice: Subject to any disclaimer, the term of this patent is extended or adjusted under 35 U.S.C. 154(b) by 158 days.

(21) Appl. No.: 13/813,830

(22) PCT Filed: Jul. 29, 2011

(86) PCT No.: PCT/JP2011/004332
§ 371 (c)(1),
(2), (4) Date: Feb. 1, 2013

(87) PCT Pub. No.: WO2012/017636
PCT Pub. Date: Feb. 9, 2012

(65) Prior Publication Data
US 2013/0128576 A1    May 23, 2013

(30) Foreign Application Priority Data

Aug. 3, 2010   (JP) ................... 2010-174783
Oct. 19, 2010  (JP) ................... 2010-234966

(51) Int. Cl.
| | | |
|---|---|---|
| F21V 13/08 | (2006.01) | |
| F21V 7/00 | (2006.01) | |
| F21V 5/04 | (2006.01) | |
| F21V 13/02 | (2006.01) | |
| F21V 5/02 | (2006.01) | |
| F21V 17/06 | (2006.01) | |
| F21V 17/16 | (2006.01) | |
| G02B 19/00 | (2006.01) | |
| F21Y 101/02 | (2006.01) | |
| H01L 33/58 | (2010.01) | |

(52) U.S. Cl.
CPC . *F21V 13/08* (2013.01); *F21V 5/04* (2013.01); *F21V 7/0091* (2013.01); *F21V 13/02* (2013.01); *F21V 7/00* (2013.01); *F21V 5/02* (2013.01); *F21V 17/06* (2013.01); *F21V 17/164* (2013.01); *G02B 19/0047* (2013.01); *G02B 19/0028* (2013.01); *G02B 19/0061* (2013.01); *F21Y 2101/02* (2013.01); *H01L 33/58* (2013.01)
USPC ........................ 362/606; 362/293; 362/235

(58) Field of Classification Search
CPC .......... F21V 5/04; F21V 7/0091; F21V 13/02
USPC .................. 362/231, 235, 297, 293, 223
See application file for complete search history.

(56) References Cited

U.S. PATENT DOCUMENTS

| | | |
|---|---|---|
| 2006/0291245 A1 | 12/2006 | Shimada |
| 2010/0027256 A1 | 2/2010 | Kinoshita |

FOREIGN PATENT DOCUMENTS

| | | |
|---|---|---|
| JP | 2005-268166 A | 9/2005 |
| JP | 2006-140090 A | 6/2006 |
| JP | 2010-40296 A | 2/2010 |

*Primary Examiner* — Elmito Breval
(74) *Attorney, Agent, or Firm* — Brundidge & Stanger, P.C.

(57) ABSTRACT

A light-emitting device combining a first luminous flux control member having a total reflection surface and emitting light from an emission surface in a narrow angle range centered mainly on an optical axis, and a second luminous flux control member arranged to surround the total reflection surface of the first luminous flux control member. The second luminous flux control member (102) of the light-emitting device is provided with a second incidence surface (126*a*) and a second emitting surface (126*b*). Of the light emitted from the light-emitting element (200), the light incident to the second incidence surface (126*a*) is within a range of angles θ larger than a largest angle to the optical axis of the light incident to the first luminous flux control member (101). The second emitting surface (126*b*) controls the light incident to the second incidence surface (126*a*) to have light distribution characteristics different from those of the light emitted from the first luminous flux control member (101), and emits the light.

16 Claims, 31 Drawing Sheets

| Z[mm]\X[mm] | 0 | 25 | 50 | 75 |
|---|---|---|---|---|
| | | | | [lx] |
| 475 | 2817 | 2746 | 2658 | 2566 |
| 425 | 1860 | 1855 | 1776 | 1729 |
| 375 | 1352 | 1345 | 1251 | 1253 |
| 325 | 1093 | 1087 | 1028 | 1029 |
| 275 | 1002 | 993 | 959 | 955 |
| 225 | 996 | 997 | 981 | 988 |
| 175 | 1059 | 1072 | 1046 | 1068 |
| 125 | 1075 | 1124 | 1045 | 1059 |
| 75 | 821 | 851 | 777 | 823 |
| 25 | 476 | 495 | 456 | 509 |
| illuminance ratio | 5.92 | 5.55 | 5.83 | 5.04 |

| Z[mm] \ X[mm] | 0 | 25 | 50 | 75 |
|---|---|---|---|---|
| 475 | 2804 | 2664 | 2615 | 2336 |
| 425 | 1900 | 1851 | 1764 | 1689 |
| 375 | 1283 | 1350 | 1301 | 1217 |
| 325 | 1107 | 1109 | 1061 | 1010 |
| 275 | 1023 | 1018 | 1001 | 948 |
| 225 | 1039 | 1048 | 1020 | 988 |
| 175 | 1120 | 1126 | 1107 | 1075 |
| 125 | 1145 | 1150 | 1099 | 1099 |
| 75 | 963 | 978 | 912 | 922 |
| 25 | 834 | 848 | 802 | 790 |
| illuminance ratio | 3.36 | 3.14 | 3.26 | 2.96 |

FIG.10

LIGHT-EMITTING DEVICE AND ILLUMINATION DEVICE

TECHNICAL FIELD

The present invention relates to a light-emitting device and an illumination apparatus and, in particular, to a light-emitting device and an illumination apparatus that illuminate a plate surface, a ceiling, a wall surface, a floor surface, a signboard, or other surfaces.

BACKGROUND ART

Auxiliary illumination, ceiling illumination, illumination for showcases, or other types of conventional illumination have been carried out with light-emitting devices for spotlighting that illuminate a specific area with radiating light in a specific direction. Recently, white-light emitting diodes (white LEDs) have been used as light sources of light-emitting devices for spotlighting.

White-light emitting diodes, which are small, power-efficient semiconductor devices emitting bright colored light, have characteristics such as no burnout, superior initial driving characteristics, and high durability against vibration and repeated on/off switching operations.

Light-emitting devices for spotlighting are also known that control the distribution characteristics of light emitted from a light-emitting diode through an illumination lens symmetrical about the optical axis of the light-emitting diode (for example, Patent Literature 1). According to Patent Literature 1, a lens having a total-reflection surface on the emission side of the light-emitting diode is disposed such that the light from the light-emitting diode at a large angle to the optical axis is incident on the lens and then is totally reflected at the total-reflection surface to emit light with a narrowed distribution. According to Patent Literature 1, an opaque cylindrical external cover that supports the upper portion of the lens and surrounds the sides of the lens is also provided to efficiently radiate the light totally reflected at the total-reflection surface of the lens, forward from the lens.

A light-emitting device for spotlighting is also known that includes a cylindrical illumination lens or an illumination lens that is rotationally-symmetrical about the optical axis of the light-emitting diode. Such an illumination lens is disposed on the emission side of the light-emitting diode and focuses the light emitted from the light-emitting diode onto a target surface.

CITATION LIST

Patent Literature

Japanese Patent Application Laid-Open No. 2005-268166

SUMMARY OF INVENTION

Technical Problem

In the case described in Patent Literature 1, the entire target surface can be uniformly illuminated with radiating light from the light-emitting device at an oblique angle to the target surface only if the distribution of light is narrow so that an area far away from the light-emitting device can be illuminated with sufficiently intense light.

Accordingly, this conventional lens is suitable for radiating light to an area far away but narrows the distribution of light. Thus, the lens has a disadvantage in that uniform illumination of the target surface with light from an oblique angle cannot provide sufficient intensity near the light source, generating a dark area near the light source. An illumination lens provided in a light-emitting device for spotlighting that illuminates an area far away requires a total-reflection surface to narrow the distribution of light incident on the lens from the light-emitting diode at a large angle to the optical axis. Thus, the attainment of the total reflection characteristics inhibits the roughening or other processing of the total-reflection surface for generation of light that radiates on the target surface near the light source.

An object of the present invention is to provide a light-emitting device and an illumination apparatus that include a first emission surface provided at an small angle to the optical axis and emitting light to a first target surface relatively far away from a light source and a second emission surface emitting light to a second target surface near the light source to enhance the illuminance near the light source.

Solution to Problem

A light-emitting device according to the present invention includes a light-emitting element and a flux control member that receives light from the light-emitting element and controls a traveling direction of incident light. The flux control member and the light-emitting element are disposed such that a center axis of the flux control member aligns with an optical axis of the light-emitting element. The flux control member includes: a first flux control member that receives part of the light from the light-emitting element, controls and emits the incident light in such a way that the emitted light has a predetermined distribution characteristic; and a second flux control member that receives light from the light-emitting element not incident on the first flux control member, controls and emits the incident light in such a way that the emitted light has a predetermined distribution characteristic. The first flux control member includes: a first incident surface that receives part of the light from the light-emitting element; a total-reflection surface that reflects part of the light incident on the first incident surface; and a first emission surface that controls part of the light incident on the first incident surface and the light reflected at the total-reflection surface to have a predetermined distribution characteristic, and emits the controlled light. The first incident surface is an inner surface of a depression in the bottom surface of the first flux control member. The total-reflection surface flares from an external edge of the bottom surface to the first emission surface. The second flux control member includes: a second incident surface that receives light from the light-emitting element, the light being incident in an angular range larger than a maximum angle of the light incident on the first flux control member to the optical axis; and a second emission surface that controls and emits the light incident on the second incident surface in such a way that the light emitted from the second emission surface has a distribution characteristic different from the distribution characteristic of the light emitted from the first flux control member, and emits the controlled light.

An illumination apparatus according to the present invention includes the light-emitting device described above; and a target surface disposed such that light from the light-emitting device emitted at a small angle from the optical axis has an incident angle larger than light from the light-emitting device emitted at a larger angle from the optical axis.

Advantageous Effects of Invention

According to the present invention, the illuminance near a light source can be increased by illuminating a target surface with a light-emitting device including a first flux control member and a second flux control member, the first flux control member having a total-reflection surface and emitting light primarily within a narrow angular range centered at an optical axis from an emission surface, the second flux control member surrounding the total-reflection surface of the first flux control member.

BRIEF DESCRIPTION OF DRAWINGS

FIG. 9 shows the illuminance of a target surface of an illumination apparatus having a first flux control member accommodated in a conventional black holder, instead of a second flux control member;

FIG. 10 shows the illuminance of a target surface of the illumination apparatus according to Embodiment 1 of the present invention;

DESCRIPTION OF EMBODIMENTS

Embodiments of the present invention will now be described in detail with reference to the drawings.

Embodiment 1

Configuration of Light-emitting Device

Figure 1A:
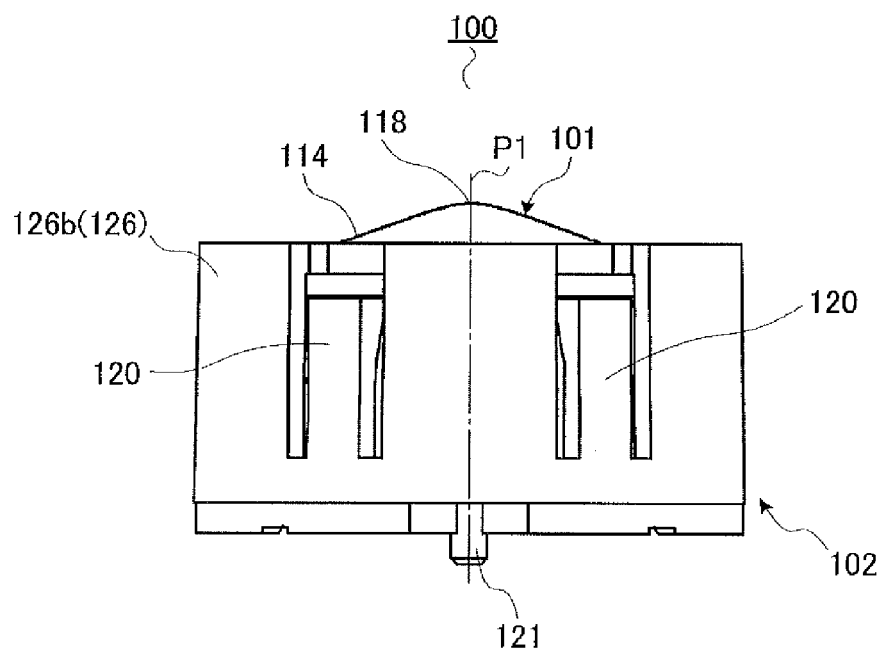
FIG. 1A is a front view of a light-emitting device according to Embodiment 1 of the present invention.
Figure 1B:
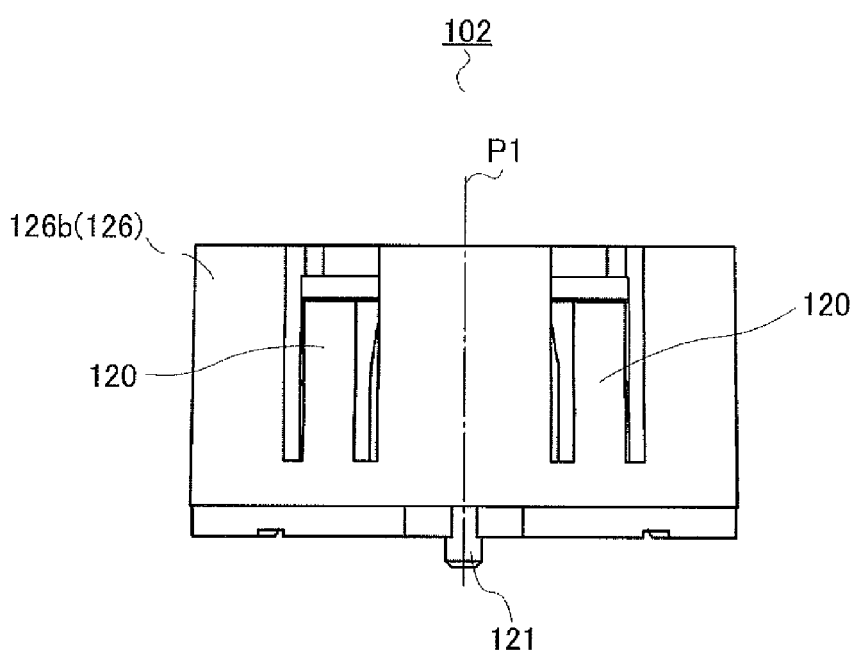
FIG. 1B is a front view of a second flux control member according to Embodiment 1 of the present invention.
Figure 2A:
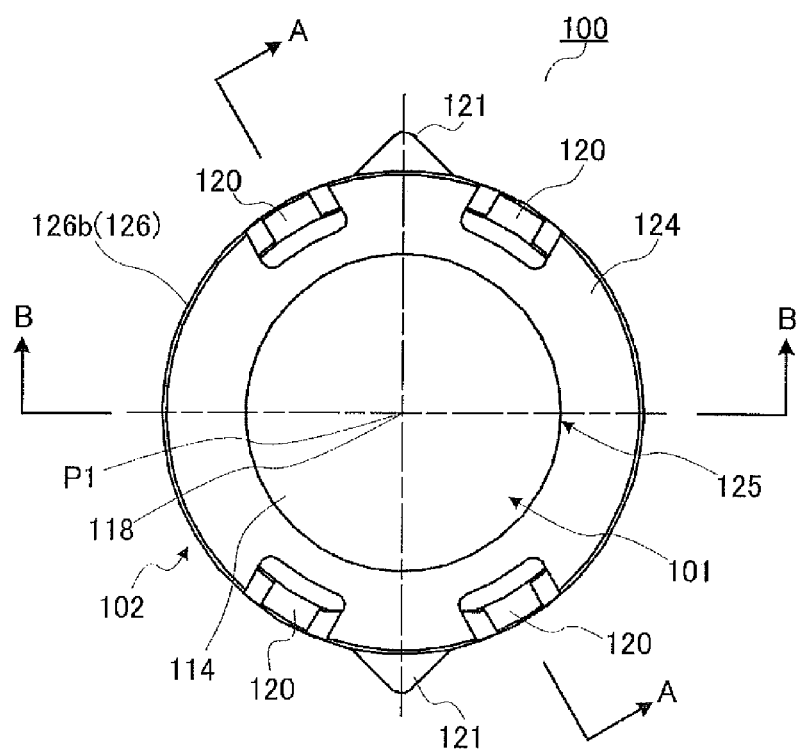
FIG. 2A is a plan view of the light-emitting device according to Embodiment 1 of the present invention.
Figure 2B:
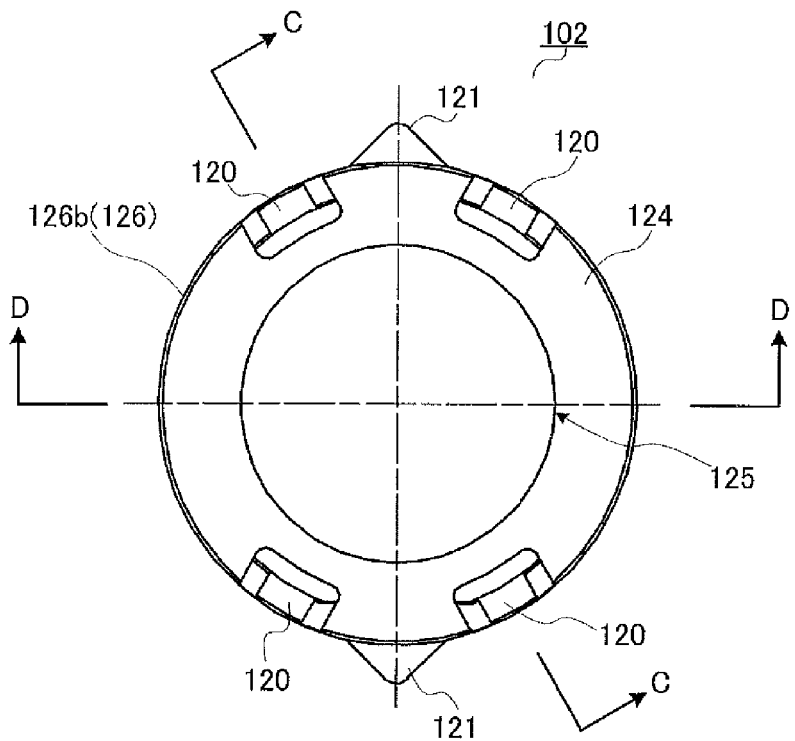
FIG. 2B is a plan view of the second flux control member according to Embodiment 1 of the present invention.
Figure 3A:
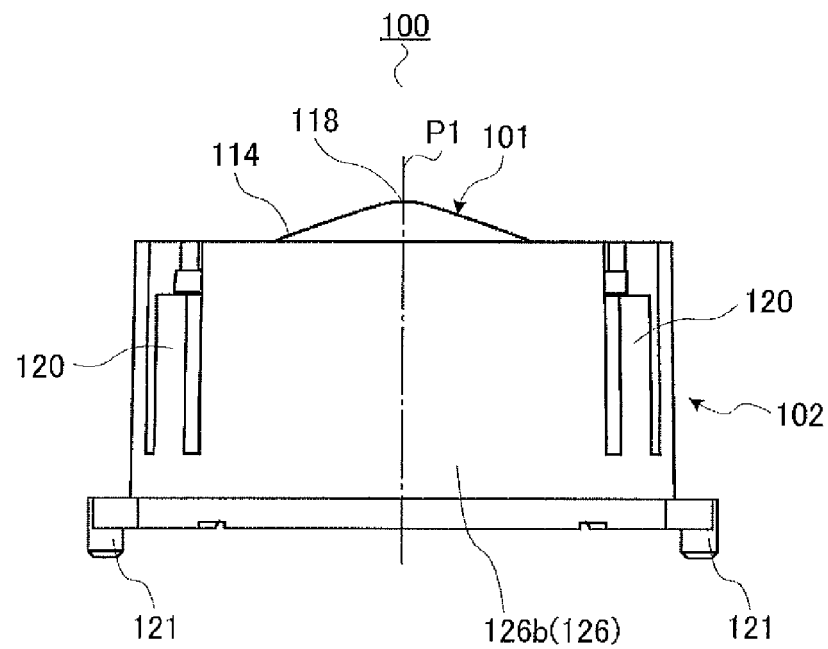
FIG. 3A is a side view of the light-emitting device according to Embodiment 1 of the present invention.
Figure 3B:
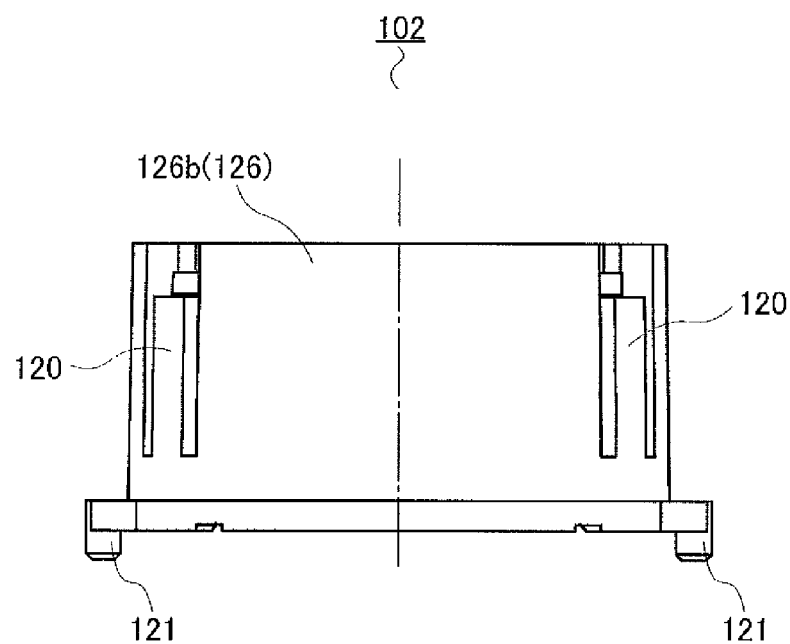
FIG. 3B is a side view of the second flux control member according to Embodiment 1 of the present invention.
Figure 4A:
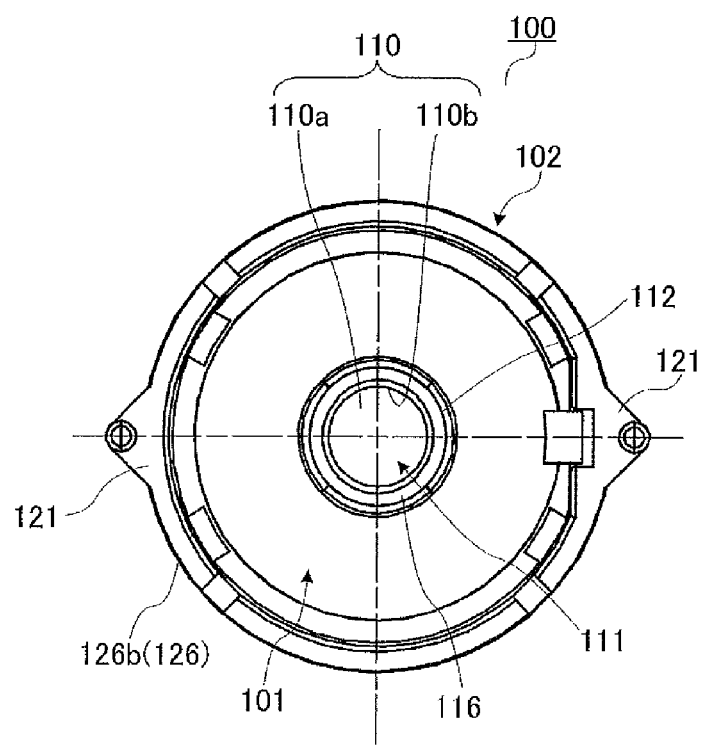
FIG. 4A is a bottom view of the light-emitting device according to Embodiment 1 of the present invention.
Figure 4B:
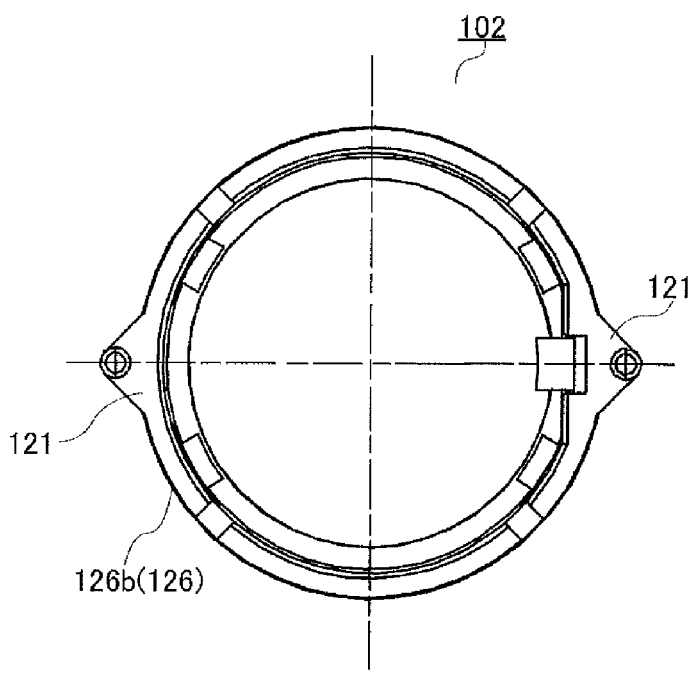
FIG. 4B is a bottom view of the second flux control member according to Embodiment 1 of the present invention.
Figure 5A:
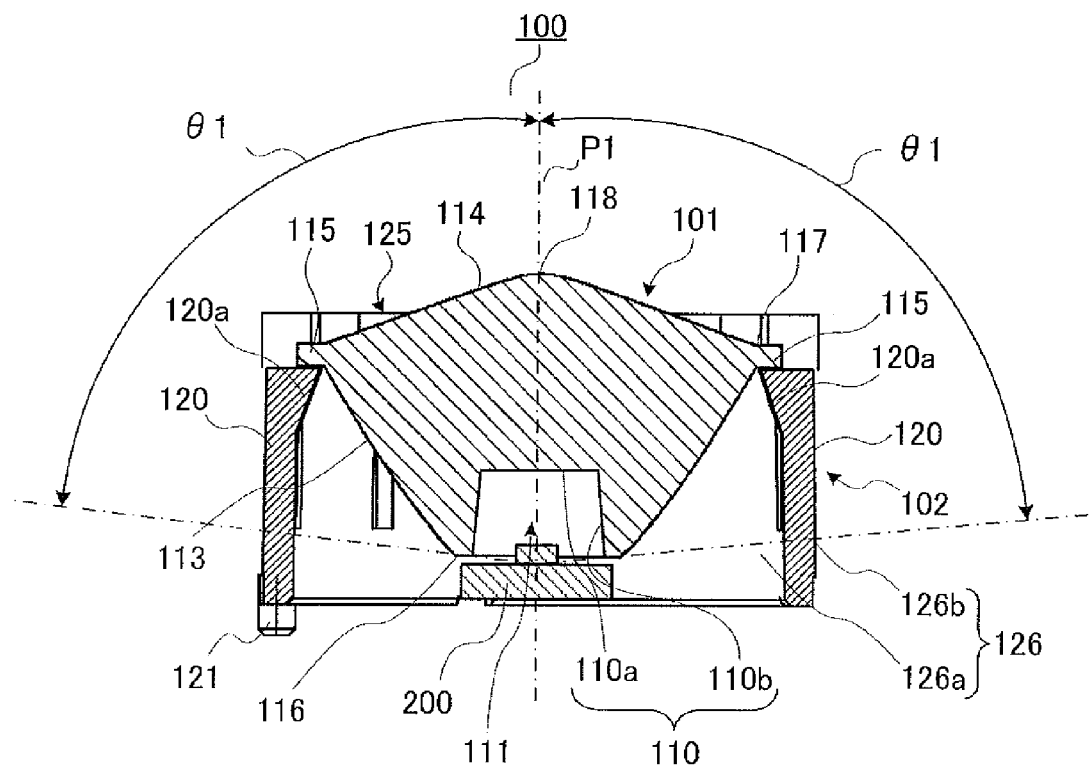
FIG. 5A is a cross-sectional view taken along line A-A in FIG. 2A.
Figure 5B:
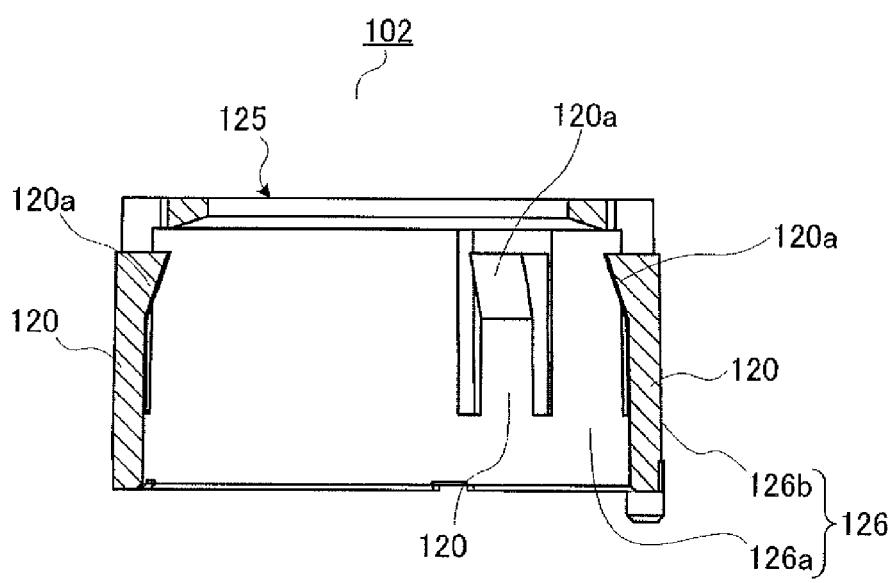
FIG. 5B is a cross-sectional view taken along line C-C in FIG. 2B.
Figure 6A:
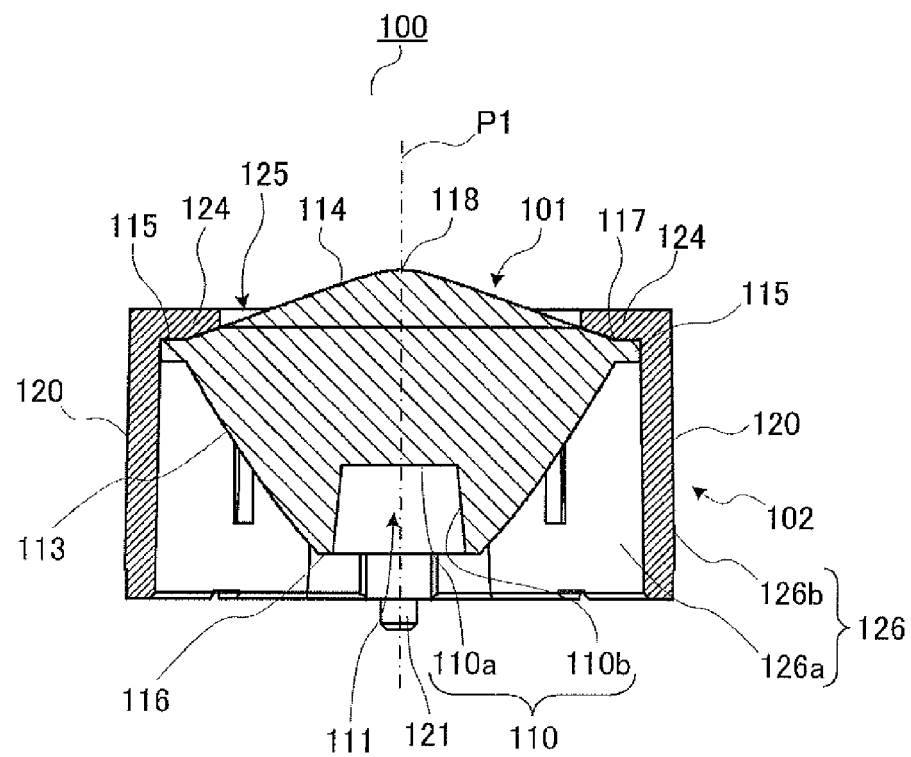
FIG. 6A is a cross-sectional view taken along line B-B in FIG. 2A.
Figure 6B:
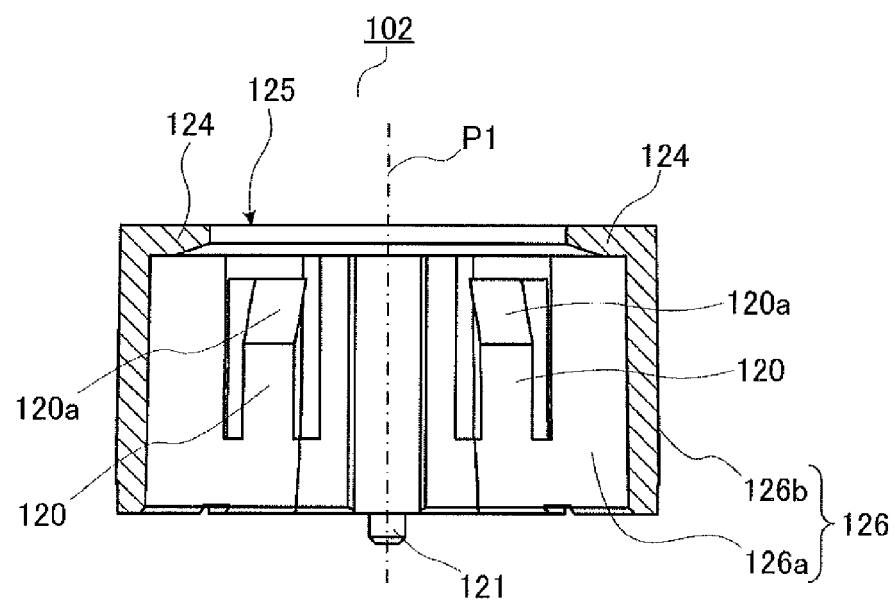
FIG. 6B is a cross-sectional view taken along line D-D in FIG. 2B.

The configuration of light-emitting device 100 will now be described in detail with reference to FIGS. 1A to 6B. FIG. 1A is front view of light-emitting device 100 according to Embodiment 1 of the present invention. FIG. 1B is a front view of second flux control member 102 according to Embodiment 1 of the present invention. FIG. 2A is a plan view of light-emitting device 100 according to Embodiment 1 of the present invention. FIG. 2B is a plan view of second flux control member 102 according to Embodiment 1 of the present invention. FIG. 3A is a side view of light-emitting device 100 according to Embodiment 1 of the present invention. FIG. 3B is a side view of second flux control member 102 according to Embodiment 1 of the present invention. FIG. 4A is a bottom view of light-emitting device 100 according to Embodiment 1 of the present invention. FIG. 4B is a bottom view of second flux control member 102 according to Embodiment 1 of the present invention. FIG. 5A is a cross-sectional view taken along line A-A in FIG. 2A. FIG. 5B is a cross-sectional view taken along line C-C in FIG. 2B. FIG. 6A is a cross-sectional view taken along line B-B in FIG. 2A. FIG. 6B is a cross-sectional view taken along line D-D in FIG. 2B. Light-emitting element 200 is omitted in FIGS. 1A, 2A, 3A, 4A, and 6A.

Light-emitting device 100 primarily includes first flux control member 101, second flux control member 102, and light-emitting element 200.

First flux control member 101 is accommodated in second flux control member 102 such that center axis P1 is aligned with the optical axis of light-emitting element 200. Part of the light from light-emitting element 200 is incident on first flux control member 101 and part of the incident light is totally reflected. In this way, the total incident light is controlled to have a distribution narrower than the spreading light from the light-emitting element 200 and is incident on a target surface (not shown).

Second flux control member 102 is a transparent hollow cylinder and is mounted on a substrate (not shown) such that center axis P1 is aligned with the optical axis of light-emitting element 200. Second flux control member 102 accommodates first flux control member 101 and positions first flux control member 101 on the substrate (not shown). Second flux control member 102 receives light that is not incident on first flux control member 101 and that is emitted from light-emitting element 200 at an angle within an angular range θ larger than the maximum angle θ1 to the optical axis of the light incident on first flux control member 101 (see FIG. 5A). Unlike the distribution characteristics of the light from first flux control member 101, the distribution characteristics of the light from second flux control member 102 is controlled such that intensity is higher in a large angular range from the optical axis than in a small angular range and such that the light is incident on a target surface (not shown) near light-emitting element 200, and the controlled light is emitted. Thus, second flux control member 102 can reduce the entrance length compared to a case where a target surface is illuminated with only first flux control member 101. The entrance length is a distance from the position of a projection of light-emitting element 200, which is a light source, on the target surface to a position on the target surface having an illuminance higher than a predetermined value, which is illuminated with the light from first flux control member 101 and second flux control member 102. Detailed configurations of first flux control member 101 and second flux control member 102 will be described below.

Light-emitting element 200 is, for example, a white-light emitting diode and is the light source of light-emitting device 100. Light-emitting element 200 is mounted on the substrate (not shown) such that its optical axis aligns with center axis P1 of first flux control member 101 and center axis P1 of second flux control member 102.

Configuration of First Flux Control Member

The configuration of first flux control member 101 will now be described in detail.

First flux control member 101 has first incident surface 110, depression 111, total-reflection surface 113, first emission surface 114, flange 115, and bottom surface 116.

First incident surface 110 constitutes the inner surface of depression 111, which is formed by inwardly depressing bottom surface 116 facing light-emitting element 200 and is rotationally symmetrical about center axis P1. First incident surface 110 has inner upper surface 110a defining the inner surface of depression 111 and tapered inner wall 110b extending from the external edge of inner upper surface 110a to the opening edge of depression 111. The inner diameter of inner wall 110b gradually increases from inner upper surface 110a to the opening edge of depression 111.

Total-reflection surface 113 constitutes an external surface extending from the outer circumferential portion of bottom surface 116 to the lower surface of flange 115 and is rotationally symmetrical about center axis P1. The total-reflection surface 113 flares from the external edge of bottom surface 116 toward the first emission surface 114. The outer diameter of total-reflection surface 113 gradually increases from bottom surface 116 to flange 115. Total-reflection surface 113 forms a convex arc-like curve with a profile line extending outward (away from center axis P1).

The projection of first emission surface 114 on a flat surface is a circle with its center aligned with center axis P1. First emission surface 114 has apex 118 at a predetermined position along center axis P1 and extends from the apex 118 to outer circumferential portion 117 of first emission surface 114 at a gentle slope such that the height from bottom surface 116 gradually decreases. First emission surface 114 is formed in a convex shape and protrudes upwards (away from bottom surface 116).

Flange 115 protrudes radially outward from outer circumferential portion 117 of first emission surface 114 and is substantially annular.

Bottom surface 116 is a flat annular surface formed around the opening edge of depression 111.

Outer circumferential portion 117 is formed around the outer circumference of first emission surface 114 and connects with flange 115.

Apex 118 is positioned on center axis P1 and protrudes from first emission surface 114.

Configuration of Second Flux Control Member

The configuration of second flux control member 102 will now be described in detail.

Second flux control member 102 has resilient portions 120, fixed portions 121, top panel 124, opening 125, and flux controlling portion 126.

Resilient portions 120 are disposed around the circumference of flux controlling portion 126 to constitute parts of the cylindrical wall (see FIGS. 2A and 2B). In this embodiment, two pairs of resilient portions 120 are disposed, the resilient portions 120 in each pair being disposed line symmetrical about center axis P1. Each resilient portion 120 is cantilevered such that the base connected to flux controlling portion 126 serves as a fixed end and fulcrum. Slits are formed downward from the upper edge of the cylindrical flux controlling portion 126 (the edge opposite to bottom surface 116 when first flux control member 101 is accommodated) such that the tip of resilient portion 120 serves as a free end. Resilient portion 120 has an engagement hook 120a protruding inward from the tip. As first flux control member 101 is inserted from the bottom of flux controlling portion 126 to fit first flux control member 101 inside second flux control member 102, resilient portions 120 resiliently deforms radially outward by the urging force of flange 115 of first flux control member 101. Resilient portions 120 return to their original positions by a resilient force after flange 115 of first flux control member 101 passes so as to fit first flux control member 101 inside second flux control member 102 at a predetermined position. As a result, the upper surfaces of engagement hooks 120a engage with the lower surface of flange 115, inhibiting the downward movement of first flux control member 101 (see FIG. 5A).

Fixed portions 121, which are auriform, protrude radially outward from the outer circumferential portion of flux controlling portion 126. In this embodiment, fixed portions 121 are positioned line symmetrically about center axis P1 (see FIGS. 2A and 2B). Fixed portions 121 are mounted on the substrate (not shown) to fix second flux control member 102 to the substrate (not shown).

Top panel 124 protrudes inward like a roof from the upper edge of cylindrical flux controlling portion 126 and has an annular shape defining opening 125. The lower surface of top panel 124 comes into contact with the upper surface of flange 115 when first flux control member 101 is accommodated, inhibiting upward movement of first flux control member 101. Top panel 124 cooperates with resilient portions 120 described above to fix first flux control member 101 inside second flux control member 102.

Opening 125 is a through-hole that extends vertically and has a predetermined diameter with the center on center axis P1 in plan view (see FIGS. 2A and 2B). Opening 125 in plan view is smaller than first emission surface 114 of first flux control member 101 and is formed in top panel 124, which overlaps with the external edge portion of first emission surface 114. Opening 125 may have substantially the same size as first emission surface 114 if top panel 124 is not required to achieve the advantages described below.

Flux controlling portion 126 is a hollow cylinder and includes second incident surface 126a and second emission surface 126b, second incident surface 126a being a roughened surface defining the inner wall of second flux control member 102 and receiving light from light-emitting element 200 and light leaking from surfaces other than first emission surface 114 of first flux control member 101, second emission surface 126b being a roughened surface defining the external wall of second flux control member 102 and emitting light incident on flux controlling portion 126. Second incident surface 126a and second emission surface 126b of flux controlling portion 126 according to this embodiment are parallel to the optical axis. Roughening is to form protrusions and depressions in a surface such that light diffuses and scatters.

Total-reflection surface 113 of first flux control member 101 processed to increase the illuminance near the light source loses the flux control ability. Thus, another surface must contribute to an increase in illuminance near the light source. That is, second flux control member 102 increases illuminance near the light source.

Configuration of Illumination Apparatus

The configuration of illumination apparatus 700 will now be described in detail.

Figure 7:
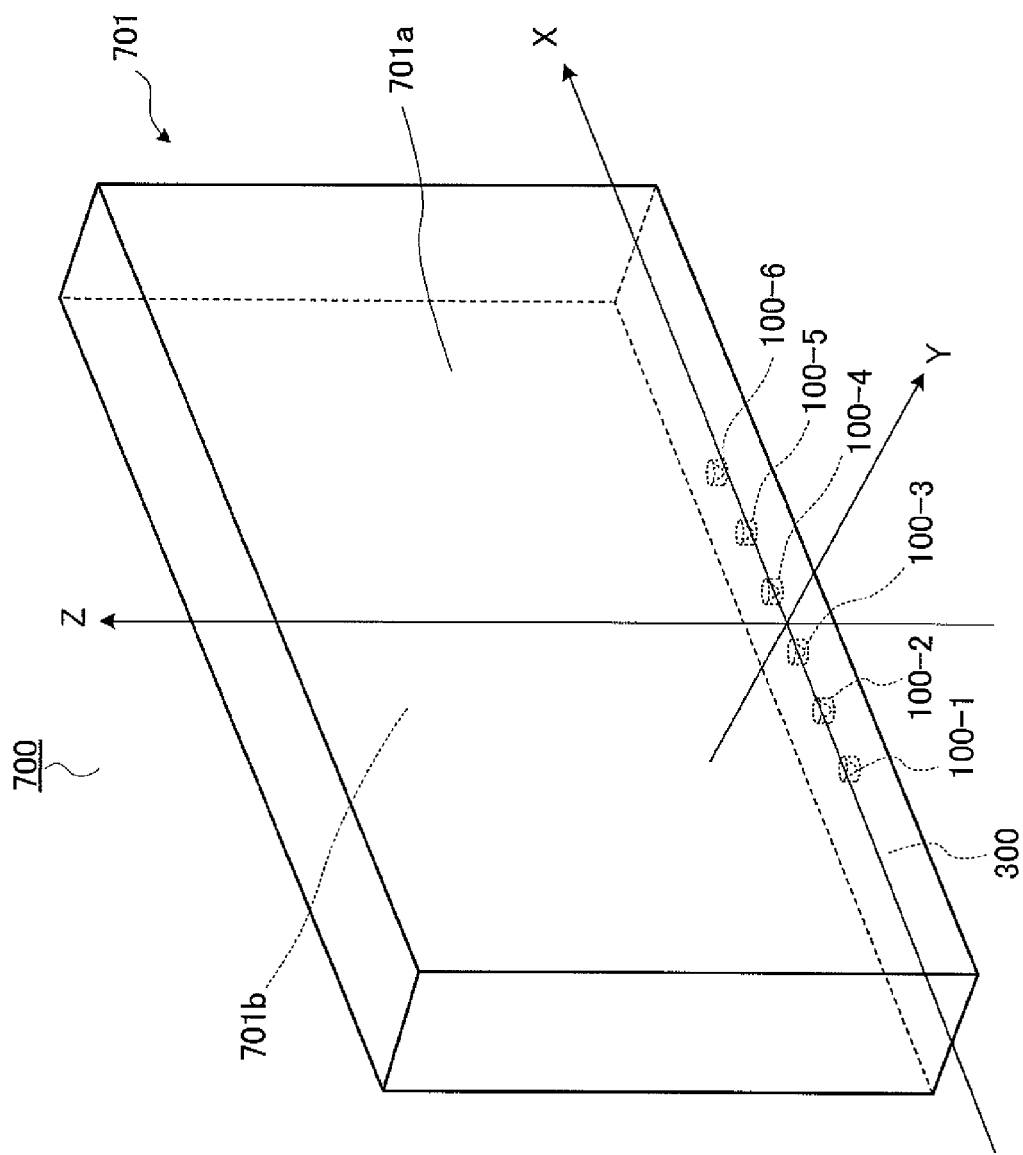
FIG. 7 is a perspective view of an illumination apparatus according to Embodiment 1 of the present invention.
Figure 8:
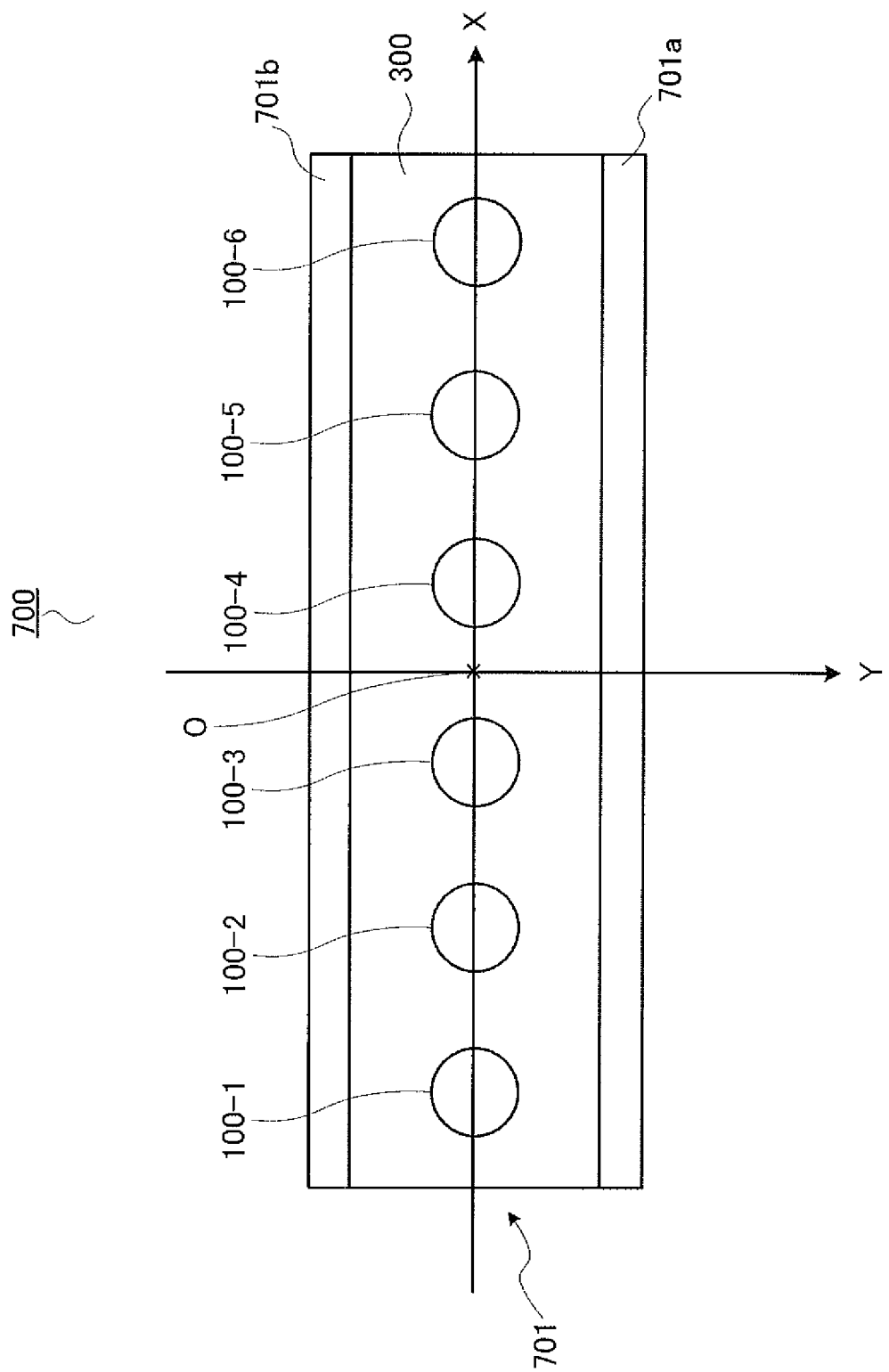
FIG. 8 is a plan view of the illumination apparatus according to Embodiment 1 of the present invention.

FIG. 7 is a perspective view of illumination apparatus 700. FIG. 8 is a plan view of illumination apparatus 700.

Illumination apparatus 700 primarily includes light-emitting devices 100-1 to 100-6, substrate 300, and target portion 701. The configuration of every light-emitting devices 100-1 to 100-6 is the same as that of light-emitting device 100 illustrated in FIGS. 1A, 2A, 3A, 4A, 5A, and 6A, and thus, the description thereon is omitted.

Light-emitting devices 100-1 to 100-6 are mounted on substrate 300 at predetermined intervals along a direction parallel to the X-axis, or the longitudinal direction of illumination apparatus 700.

Light-emitting devices 100-1 to 100-6 are mounted on substrate 300 at predetermined intervals in a direction parallel to the X-axis. Substrate 300 is disposed on the bottom surface of illumination apparatus 700.

Target portion 701 is rectangular and has a target surface 701a and opposing target surface 701b.

Target surface 701a, which is parallel to the X-Z plane, is decorated with, for example, characters and/or illustrations for advertisement and is illuminated from an oblique angle with light from the interior of light-emitting devices 100-1 to 100-6. The light from light-emitting devices 100-1 to 100-6 at a small angle to the optical axis is incident on target surface 701a at an angle larger than the light emitted from light-emitting devices 100-1 to 100-6 at a large angle to the optical axis.

Opposing target surface 701b, which opposes target surface 701a and is parallel to the target surface 701a and the X-Z plane, is decorated with, for example, characters and/or illustrations for advertisement and is illuminated at an oblique angle with light from the interior by light-emitting devices 100-1 to 100-6. The light from light-emitting devices 100-1 to 100-6 at a small angle to the optical axis is incident on opposing target surface 701b at an angle larger than the light emitted from light-emitting devices 100-1 to 100-6 at a large angle to the optical axis.

Spotlighting carried out by narrowing the distribution of the light from light-emitting element 200 and enhancing the intensity within a small angular range to the optical axis is usually achieved by narrowing the area illuminated in target portion 701, such as that illustrated in FIG. 7. That is, light beams are collected in a small angular range from the optical axis to enhance the illuminance of target surface 701a and opposing target surface 701b disposed away from light-emitting element 200. However, an insufficient number of light beams illuminate the area near light-emitting element 200, causing a reduction in the illuminance of target portion 701 near light-emitting element 200 and an increase in entrance length. Thus, in this embodiment, since second incident surface 126a and second emission surface 126b of second flux control member 102 are roughened, these surfaces 126a and 126b diffuses the light entering and being emitted from second flux control member 102, and the diffused light is incident on target surface 701a and opposing target surface 701b near light-emitting element 200, reducing the entrance length. A reduced entrance length can reduce the thickness of the frames of target surface 701a and opposing target surface 701b.

Measurements of Illumination Apparatus

The measured illuminance of illumination apparatus 700 will be described with reference to FIGS. 9 and 10. FIG. 9 shows the illuminance measured in lux (1x) at a target surface of an illumination apparatus (light-emitting surface on the exterior of target portion 701) having first flux control member 101 accommodated in a conventional black holder, instead of second flux control member 102. FIG. 10 shows the illuminance measured in lux (1×) at target surface 701a of illumination apparatus 700 (light-emitting surface on the exterior of target portion 701) according to this embodiment.

The X and Z axes in FIGS. 9 and 10 will now be described. Light-emitting devices 100-1 to 100-6 are aligned along the X-axis of an XYZ coordinate system in which the axes are orthogonal to each other. The light-emitting devices are disposed such that their optical axes are parallel to the Z-axis. The midpoint O between light-emitting devices 100-3 and 100-4 (see FIG. 8) is defined as the origin 0 on the X-axis. Target surface 701a is disposed parallel to the XZ plane where Y=40 mm.

Light-emitting devices 100-1 to 100-6 are disposed at a pitch of 50 mm, where light-emitting device 100-4 is disposed at the coordinates (X,Y,Z)=(25,0,0). FIGS. 9 and 10 show the illuminance on target surface 701a of illumination apparatus 700 in such positional relationship at a total of 40 points: four points along the X-axis and ten points along the Z-axis. The illuminance ratio indicates a variation in illuminance along the Z-axis with the X value fixed and is derived by dividing the maximum illuminance with the minimum illuminance, the illuminance being measured among the illuminance measured at the ten points along the Z-axis from 25 mm to 475 mm with the X value fixed. If the calculated value is small, the variation in illuminance is small.

Referring to FIGS. 9 and 10, illumination apparatus 700 according this embodiment has significantly enhanced illuminance near the light source at heights of 25 and 75 mm and a reduced entrance length, compared to a conventional illumination apparatus. Illumination apparatus 700 according to this embodiment has a small illumination ratio at the points along the X-axis and a small variation in illuminance along the Z-axis, compared to a conventional illumination apparatus.

Illumination apparatus 700 illustrated in FIGS. 7 and 8 for internal illumination illuminates target portion 701 from the interior. However, the present invention is not limited thereto. Instead, an illumination apparatus for external illumination may illuminate a target portion from the exterior. In external illumination, the characters and/or illustrations on target surface 701a may be illuminated by light-emitting devices 100-1 to 100-6 from the exterior.

Advantageous Effects of this Embodiment

According to this embodiment, an emission surface that differs from an emission surface emitting light with a narrowed distribution and that has distribution characteristics of illuminating an area near the light source can enhance the illuminance near the light source and reduce the entrance length.

An illumination apparatus according to this embodiment for internal illumination illuminating a target surface from the interior allows the target surface to have a thin frame. This can increase the flexibility in the area on the target surface in which characters and/or illustrations are depicted.

The distance can be small between the target surface and the light source in the illumination apparatus according to this embodiment for external illumination illuminating a target surface from the exterior, reducing the size and thickness of the illumination apparatus, thus reducing the installation space of the illumination apparatus.

According to this embodiment, the second flux control member that illuminates an area near the light source also serves as a holder of the first flux control member. This configuration does not require a lens dedicated to illumination of the area near the light source. Accordingly, this embodiment can reduce the number of components, as well as reducing manufacturing costs.

Modification of Embodiment 1

Configuration of Light-Emitting Device

Figure 11:
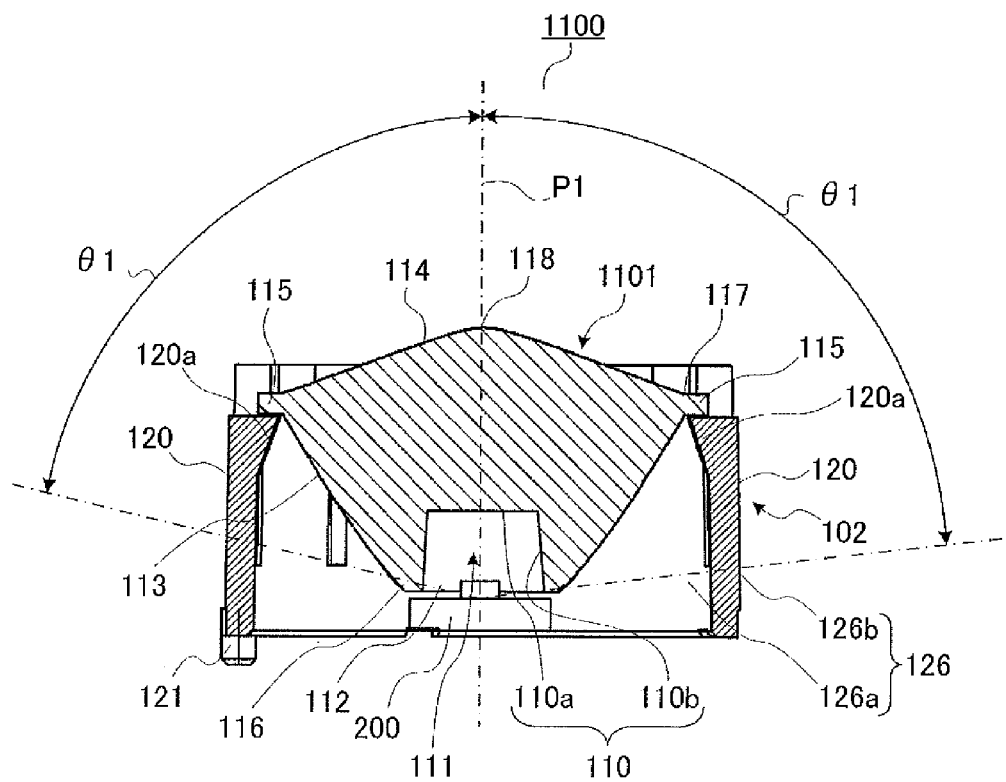
FIG. 11 is a cross-sectional view of a light-emitting device according to a modification of Embodiment 1 of the present invention corresponding to the cross-sectional view taken along line A-A in FIG. 2.
Figure 12:
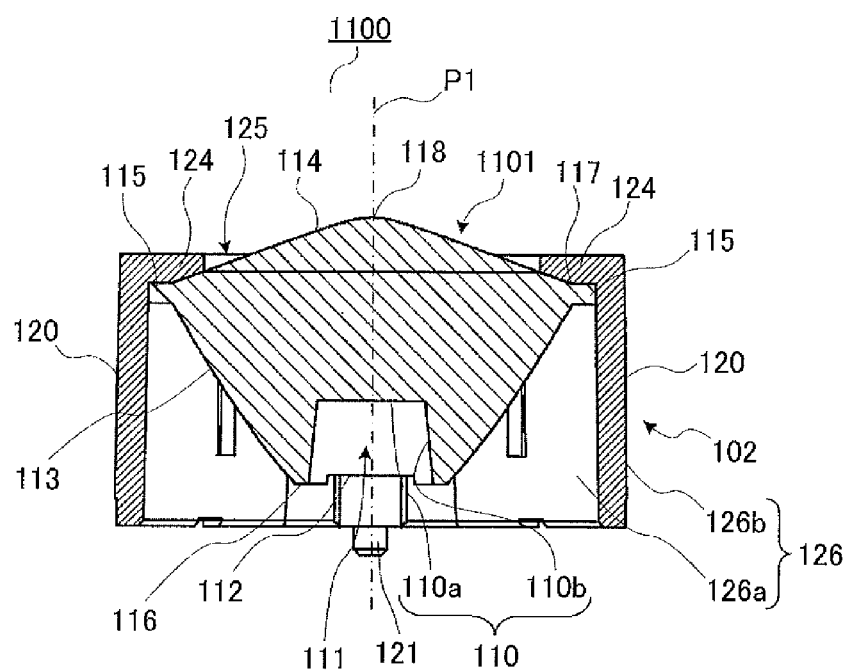
FIG. 12 is a cross-sectional view of the light-emitting device according to the modification of Embodiment 1 of the present invention corresponding to the cross-sectional view taken along line B-B in FIG. 2.
Figure 13:
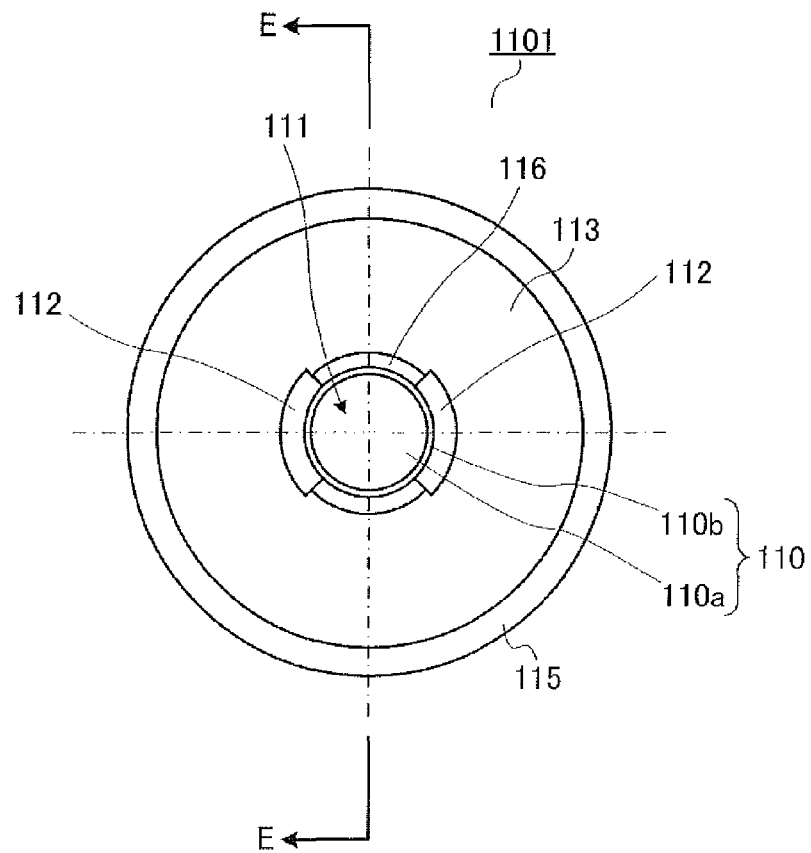
FIG. 13 is a bottom view of a first flux control member according to a modification of Embodiment 1 of the present invention.
Figure 14:
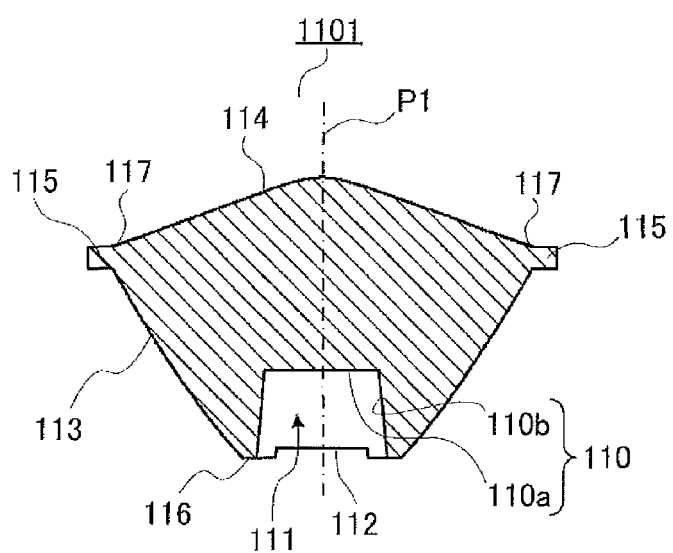
FIG. 14 is a cross-sectional view taken along line E-E in FIG. 13.

A modification of the light-emitting device according to Embodiment 1 of the present invention will now be described in detail. FIG. 11 is a cross-sectional view of light-emitting device 1100 according to the modification of this embodiment corresponding to the cross-sectional view taken along line A-A in FIG. 2. FIG. 12 is a cross-sectional view of light-emitting device 1100 according to the modification of this embodiment corresponding to the cross-sectional view taken along line B-B in FIG. 2. FIG. 13 is a bottom view of first flux control member 1101. FIG. 14 is a cross-sectional view taken along line E-E in FIG. 13. Light-emitting element 200 is omitted in FIG. 12.

Light-emitting device 1100 illustrated in FIGS. 11 and 12 is the same as light-emitting device 100 according to Embodiment 1 illustrated in FIGS. 1A, 2A, 3A, 4A, 5A, and 6A, except that notches 112 are formed. In FIGS. 11 to 14, the same elements as those in FIGS. 1A to 6B will be designated by the same reference numerals, without repeated descriptions.

First flux control member 1101 of light-emitting device 1100 according to the modification of this embodiment has groove-like notches 112 formed by cutting out parts of the opening edge of depression 111 on bottom surface 116 of first flux control member 1101. Notches 112 open on first incident surface 110 and total-reflection surface 113. Two notches 112 are formed symmetrically about center axis P1. Notches 112 are formed to generate leaked light so as to direct part of the light from light-emitting element 200 to second flux control member 102, without incidence of first flux control member 1101.

Configuration of Illumination Apparatus

Figure 15:
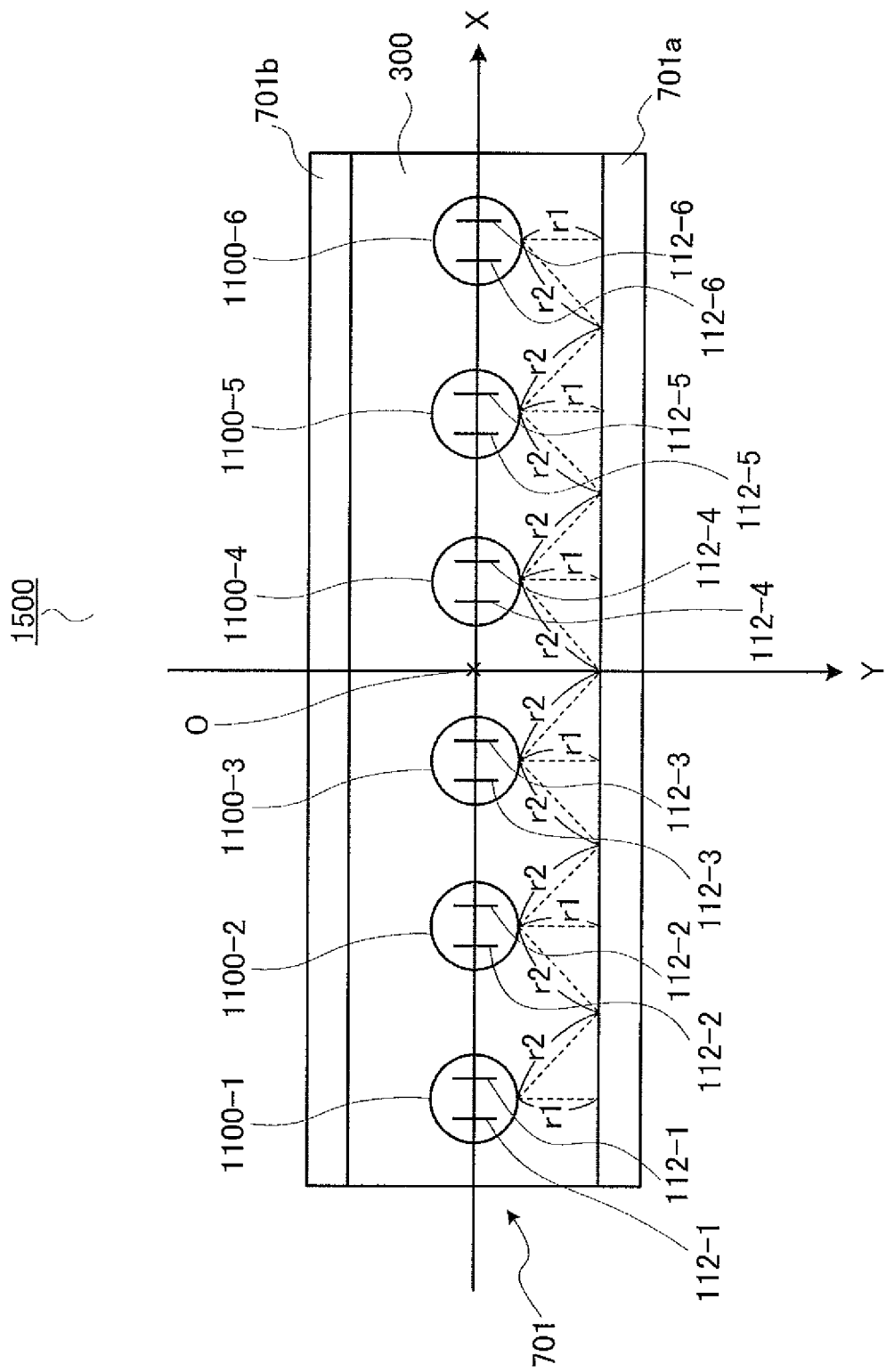
FIG. 15 is a plan view of an illumination apparatus according to a modification of Embodiment 1 of the present invention.

FIG. 15 is a plan view of illumination apparatus 1500 according to the modification of Embodiment 1 of the present invention.

Illumination apparatus 1500 illustrated in FIG. 15 is the same as illumination apparatus 700 according to Embodiment 1 illustrated in FIGS. 7 and 8, except that light-emitting devices 1100-1 to 1100-6 are provided instead of light-emitting devices 100-1 to 100-6.

In FIG. 15, the same elements as those in FIGS. 7 and 8 will be designated by the same reference numerals, without repeated descriptions. A perspective view of illumination apparatus 1500 and a description thereof are omitted because they are the same as FIG. 7, except that light-emitting devices 1100-1 to 1100-6 are provided instead of light-emitting devices 100-1 to 100-6. Only notches 112-1 to 112-6 are illustrated in FIG. 15 for explanatory purposes. Light-emitting devices 1100-1 to 1100-6 in FIG. 15 have the same configuration as light-emitting device 1100 in FIGS. 11 and 12. Notches 112-1 to 112-6 in FIG. 15 have the same configuration as notches 112 in FIGS. 11 to 14.

Light-emitting devices 1100-1 to 1100-6 are disposed on substrate 300 such that notches 112-1 to 112-6 align along the X-axis.

Advantage Effects of Modification of Embodiment 1

Every point on (the entire circumference of) second emission surface 126b of second flux control member 102 in each light-emitting device 100-1 to 100-6 not having respective notches 112-1 to 112-6 emits light of substantially the same intensity. Thus, the illuminance of areas of the light-emitting faces (external faces) of target surfaces 701a opposing light-emitting device 1100-1 to 1100-6 (areas at a distance r1 from light-emitting device 1100-1 to 1100-6 (see FIG. 15) that receive light from second emission surface 126b on the inner faces of target surfaces 701a at a relatively small incident angle) is higher than the illuminance of the light-emitting faces (external faces) of target surfaces 701a opposing the area at the middle between adjacent light-emitting device 1100-1 to 1100-6 (areas at a distance r2 from light-emitting device 1100-1 to 1100-6 (see FIG. 15) that receive light from second emission surface 126b on the inner faces of target surfaces 701a at a relatively large incident angle). Such a difference in illuminance causes a variation in illuminance on target surface 701a.

In the modification of Embodiment 1 described above, light-emitting devices 1100-1 to 1100-6 are disposed on substrate 300 such that all the notches 112-1 to 112-6 align on the X-axis. According to the modification of Embodiment 1, the light from light-emitting element 200 that is deflected by notches 112-1 to 112-6 and does not enter first flux control member 101 enters second flux control member 102. Thus, according to the modification of Embodiment 1, the light from second flux control member 102 has distribution characteristics that enhance the intensity at areas on second emission surface 126b corresponding to notches 112-1 to 112-6 higher than the intensity of other areas around the circumference. As a result, the difference is small between the illuminance at areas on the light-emitting surfaces (external faces) of target surfaces 701a corresponding areas at a distance r1 from light-emitting devices 1100-1 to 1100-6 and the illuminance at areas on the light-emitting surfaces (external faces) of target surfaces 701a corresponding to areas at a distance r2 from light-emitting devices 1100-1 to 1100-6, reducing the variation in illuminance on target surfaces 701a. Opposing target surfaces 701b are the same as target surfaces 701a. Thus, the description thereon is not repeated.

The light that leaks through notches 112-1 to 112-6 has low intensity. This light entering a target surface near a light-emitting device at a small incident angle would form a distinctly bright area on the target surface. According to the modification of Embodiment 1, notches are formed in first flux control members to allow light from light-emitting devices to leak to the exterior, and the light-emitting devices are disposed such that the notches are aligned on the X-axis, which is parallel to a target surface, away from the target surface. The modification of this embodiment can increase the incident angle of the light on the target surface from the second emission surfaces generated from leaked light, prevent the generation of distinctly bright areas, and supply illumination light to be received by areas on the target surfaces opposing the area at the middle between light-emitting devices, which tend to be dark. Thus, the modification of Embodiment 1 can enhance the illuminance on the target surfaces opposing the area at the middle between adjacent light-emitting devices and prevent a variation in the illuminance of target surfaces.

Illumination apparatus 1500 illustrated in FIG. 15 for internal illumination illuminates target portion 701 from the interior. However, the present invention is not limited thereto and may provide external illumination in which a target portion is illuminated from the exterior. In external illumination, the characters and/or pictures on target surface 701a are illuminated by light-emitting devices 1100-1 to 1100-6 from the exterior.

Embodiment 2

Figure 16:
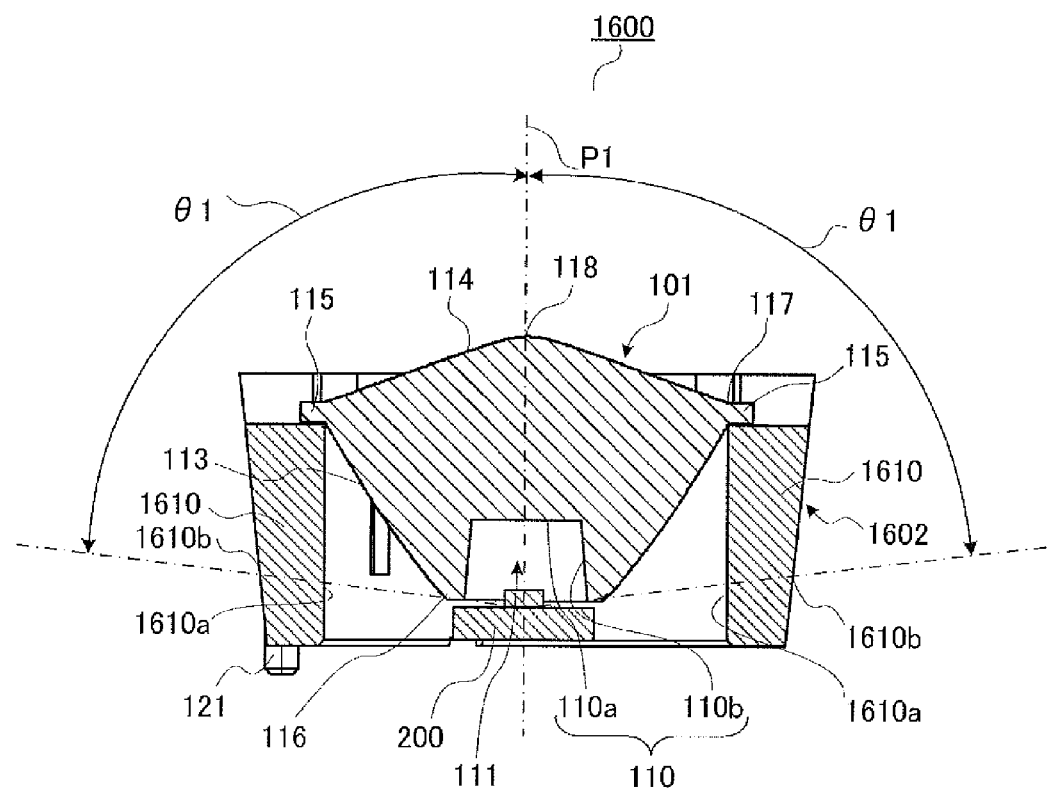
FIG. 16 is a cross-sectional view of a light-emitting device according to Embodiment 2 of the present invention.

FIG. 16 is a cross-sectional view of light-emitting device 1600 according to Embodiment 2 of the present invention. In FIG. 16, the same elements as those in FIGS. 1A to 6B will be designated by the same reference numerals, without repeated descriptions.

Second flux control member 1602 differs from second flux control member 102 according to Embodiment 1 in that the thickness of cylindrical flux control portion 1610 varies from the upper end to the lower end.

Flux control portion 1610 has a second incident surface 1610a and a second emission surface 1610b, second incident surface 1610a being rotationally symmetrical about the optical axis (center axis P1) and parallel to the optical axis, second emission surface 1610b being rotationally symmetrical about the optical axis and tilting such that the lower end is closer to the optical axis than the upper end. Controlling the tilt angle of second emission surface 1610b varies the thickness of flux control portion 1610 in the Z-axis direction, enabling control of the distribution characteristics of the light from second emission surface 1610b by flux control portion 1610. In addition to the tilt of second emission surface 1610b in flux control portion 1610, at least one of second incident surface 1610a and second emission surface 1610b may be roughened. This is however not essential if second emission surface 1610b tilts. That is, second flux control member 1602 should have at least one of the diffusion capacity and refractive ability of light incident on second flux control member 1602 so as to generate light incident on an area in target portion 701 near light-emitting device 1600.

Light-emitting device 1600 having the configuration described above receives the light from light-emitting element 200 at second incident surface 1610a and emits the light from the tilting second emission surface 1610b. As a result, light-emitting device 1600 can emit light upward compared to light emitted from a non-tilted emission surface.

The configuration of illumination apparatus according to this embodiment is the same as the configurations illustrated in FIGS. 7, 8, and 15, except that light-emitting devices 100-1 to 100-6 in FIGS. 7 and 8 or light-emitting devices 1100-1 to 1100-6 in FIG. 15 are replaced by light-emitting devices 1600-1 to 1600-6, having the same configuration as that of light-emitting device 1600, without repeated descriptions.

According to this embodiment, in addition to the advantageous effects of Embodiment 1, the light emitted upward from the tilting emission surface of the second flux control member can increase the illuminance of an area near the light source, as well as the target surface slightly above the light source.

Embodiment 3

Figure 17:
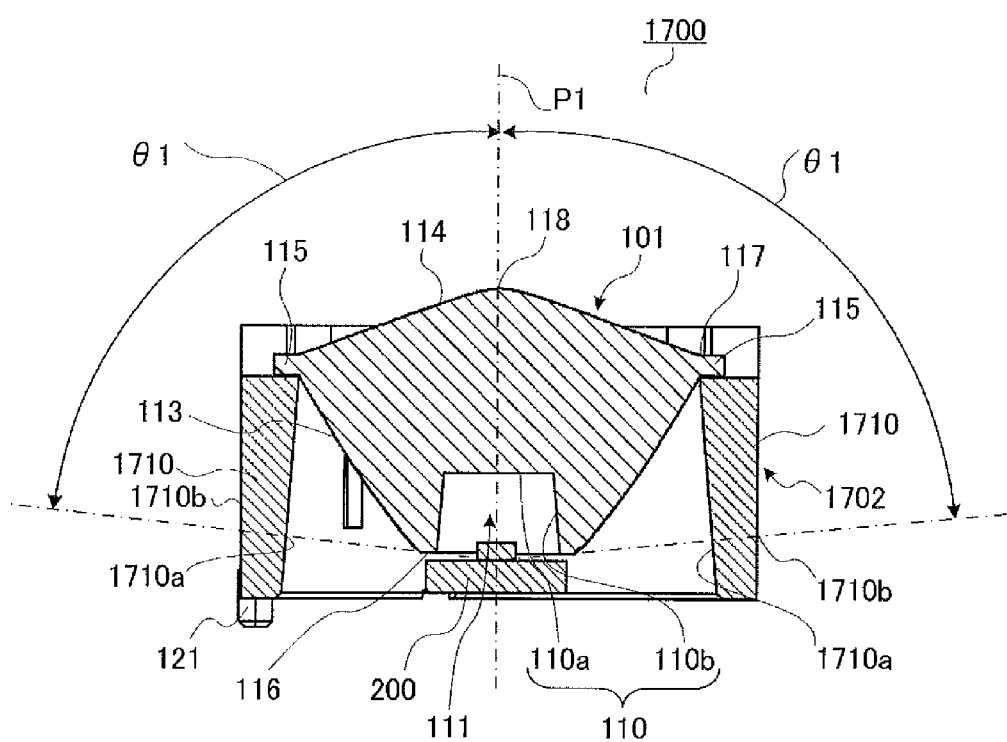
FIG. 17 is a cross-sectional view of a light-emitting device according to Embodiment 3 of the present invention.

FIG. 17 is a cross-sectional view of light-emitting device 1700 according to Embodiment 3 of the present invention. In FIG. 17, the same elements as those in FIGS. 1A to 6B will be designated by the same reference numerals, without repeated descriptions.

Second flux control member 1702 differs from second flux control member 102 according to Embodiment 1 in that the thickness of cylindrical flux control portion 1710 varies from the upper end to the lower end.

Flux control portion 1710 has second incident surface 1710a and second emission surface 1710b, second incident surface 1710a being rotationally symmetrical about the optical axis (center axis P1) and tilting in such a manner that the lower end is further away from the optical axis than the upper end, second emission surface 1710b being rotationally symmetrical about the optical axis and parallel to the optical axis. Controlling the tilt angle of second incident surface 1710a varies the thickness of flux control portion 1710 in the Z-axis direction, enabling control of the distribution characteristics of the light from second emission surface 1710b by flux control portion 1710. In addition to the tilt of second incident surface 1710a in flux control portion 1710, at least one of second incident surface 1710a and second emission surface 1710b may be roughened. This is however not essential if second incident surface 1710a tilts. That is, second flux control member 1702 should have at least one of the diffusion capacity and refractive ability of light incident on second flux control member 1702 so as to generate light incident on an area in target portion 701 near light-emitting device 1700.

Light-emitting device 1700 having the configuration described above receives the light from light-emitting element 200 at tilting second incident surface 1710a and emits the light from the second emission surface 1710b. As a result, light-emitting device 1700 can receive and emit upward light compared to light emitted from a non-tilted emission surface.

The configuration of illumination apparatus according to this embodiment is the same as the configurations illustrated in FIGS. 7, 8, and 15, except that light-emitting devices 100-1 to 100-6 in FIGS. 7 and 8 or light-emitting devices 1100-1 to 1100-6 in FIG. 15 are replaced by light-emitting devices 1700-1 to 1700-6, having the same configuration as that of light-emitting device 1700, without repeated descriptions.

According to this embodiment, in addition to the advantageous effects of Embodiment 1, the light emitted upward from the tilting incident surface of the second flux control member increases the illuminance of an area near the light source, as well as the target surface slightly above the light source.

Embodiment 4

Figure 18:
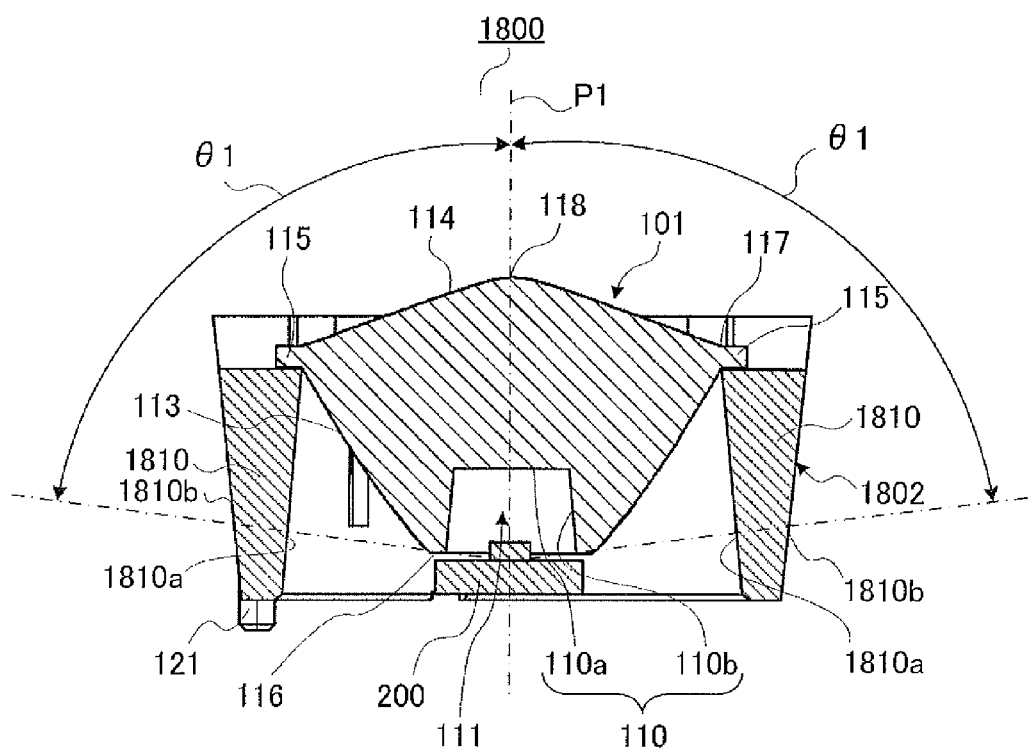
FIG. 18 is a cross-sectional view of a light-emitting device according to Embodiment 4 of the present invention.

FIG. 18 is a cross-sectional view of light-emitting device 1800 according to Embodiment 4 of the present invention. In FIG. 18, the same elements as those in FIGS. 1A to 6B will be designated by the same reference numerals, without repeated descriptions.

Second flux control member 1802 differs from second flux control member 102 according to Embodiment 1 in that the thickness of cylindrical flux control portion 1810 varies from the upper end to the lower end.

Flux control portion 1810 has second incident surface 1810a and second emission surface 1810b, second incident surface 1810a being rotationally symmetrical about the optical axis (center axis P1) and tilting in such a manner that the lower end is further away from the optical axis than the upper end, second emission surface 1810b being rotationally symmetrical about the optical axis and tilting in such a manner that the lower end is closer to the optical axis than the upper end. Controlling the tilt angles of second incident surface 1810a and second emission surface 1810b varies the thickness of flux control portion 1810 in the Z-axis direction, enabling control of the distribution characteristics of the light from second emission surface 1810b by flux control portion 1810. In addition to the tilt of second incident surface 1810a and second emission surface 1810b in flux control portion 1810, at least one of second incident surface 1810a and second emission surface 1810b may be roughened, although not essential. That is, second flux control member 1802 should have at least one of the diffusion capacity and refractive ability of light incident on second flux control member 1802 so as to generate light incident on an area in target portion 701 near light-emitting device 1800.

Second emission surface 1810b of light-emitting device 1800 having the configuration described above can emit light more upward compared to Embodiment 1 in which the incident surface and emission surface of flux control portion 1810 are both disposed rotationally symmetrical about the optical axis and parallel to the optical axis.

Figure 19:
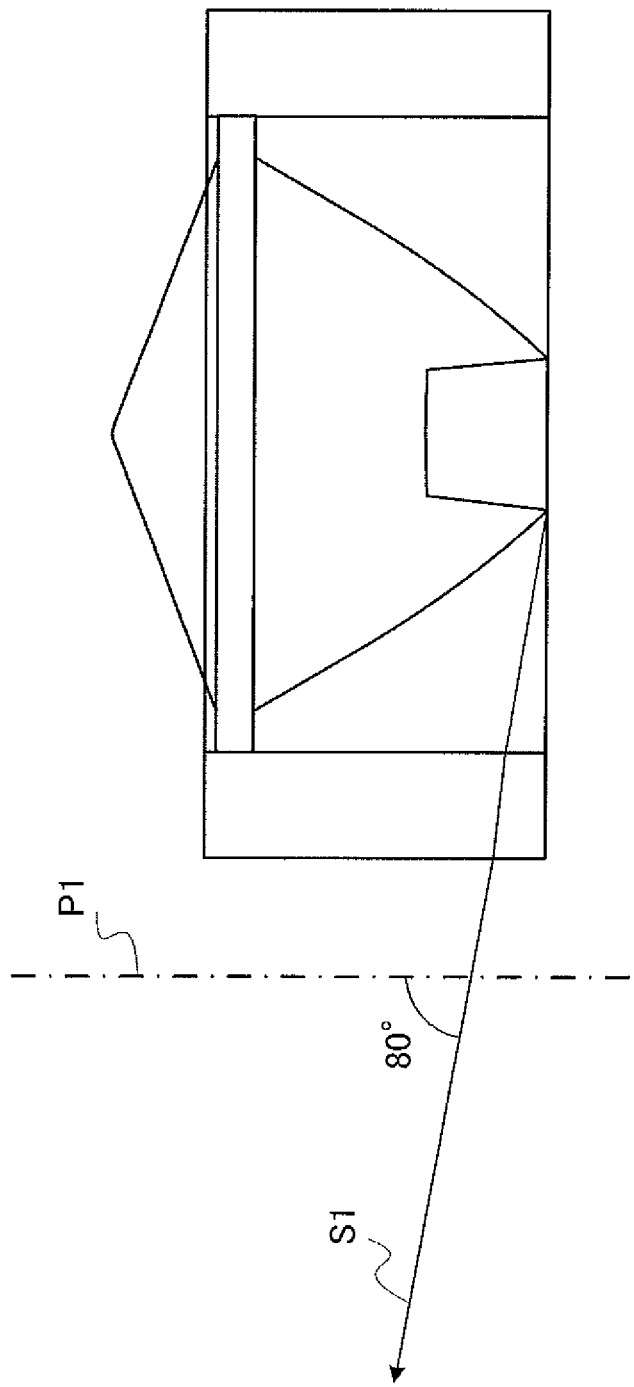
FIG. 19 illustrates, as comparative example of the light-emitting device according to Embodiment 4 of the present invention, a light path through an incident surface and an emission surface, which are disposed parallel to the optical axis and smooth surfaces, such as those in the light-emitting device according to Embodiment 1 of the present invention.
Figure 20:
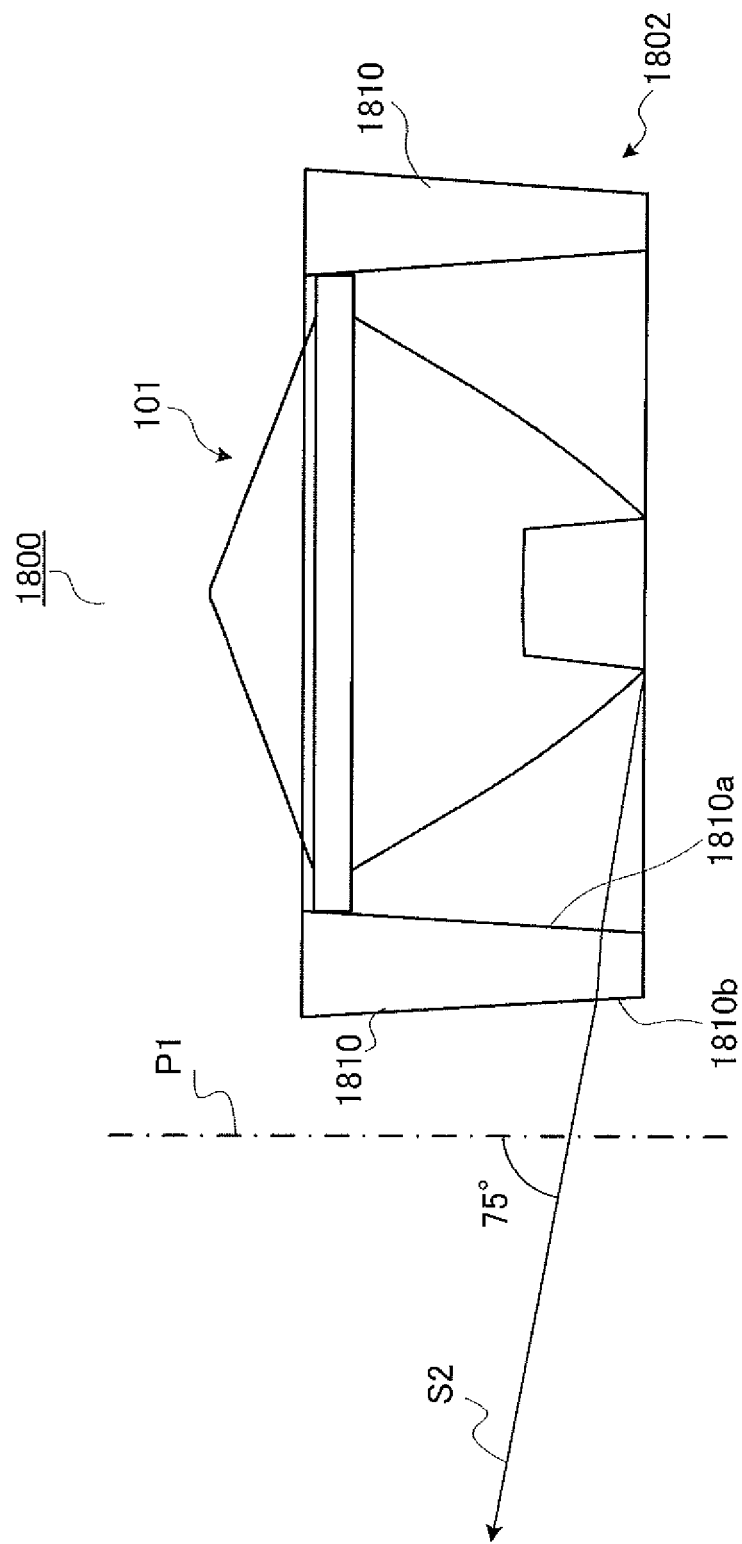
FIG. 20 illustrates a light path through an incident surface and an emission surface tilting relative to the optical axis, such as those in the light-emitting device according to Embodiment 4 of the present invention.

FIG. 19 illustrates a comparative example of light-emitting device 1800 according to this embodiment and light path S1 through second incident surface 126a and second emission surface 126b, which are disposed parallel to the optical axis and have smooth surfaces (without roughening), such as those in light-emitting device 100 according to Embodiment 1. FIG. 20 illustrates light path S2 through incident surface 1810a and emission surface 1810b tilting relative to the optical axis, such as those in light-emitting device 1800 according to this embodiment.

As illustrated in FIG. 19, in light-emitting device 100 according to Embodiment 1, the light emitted from light-emitting element 200 at an angle of 80 degrees from the optical axis is emitted from second flux control member 102 at an angle of approximately 80 degrees from the optical axis. In contrast, as illustrated in FIG. 20, in light-emitting device 1800 according to this embodiment, the light from second emission surface 1810b through second flux control member 1802 is emitted at an angle of approximately 75 degrees from the optical axis. That is, light-emitting device 1800 according to this embodiment, which is illustrated in FIG. 20, can emit light more upward by approximately 5 degrees compared to light-emitting device 100 according to Embodiment 1, which is illustrated in FIG. 19.

The configuration of illumination apparatus according to this embodiment is the same as the configurations illustrated in FIGS. 7, 8, and 15, except that light-emitting devices 100-1 to 100-6 in FIGS. 7 and 8 or light-emitting devices 1100-1 to 1100-6 in FIG. 15 are replaced by light-emitting devices 1800-1 to 1800-6, having the same configuration as that of light-emitting device 1800, without repeated descriptions.

According to this embodiment, in addition to the advantageous effects of Embodiment 1, the light emitted upward from the tilting incident and emission surfaces of the second flux control member increases the illuminance of an area near the light source, as well as the target surface slightly above the light source.

Embodiment 5

Configuration of Light-Emitting Device

Figure 21:
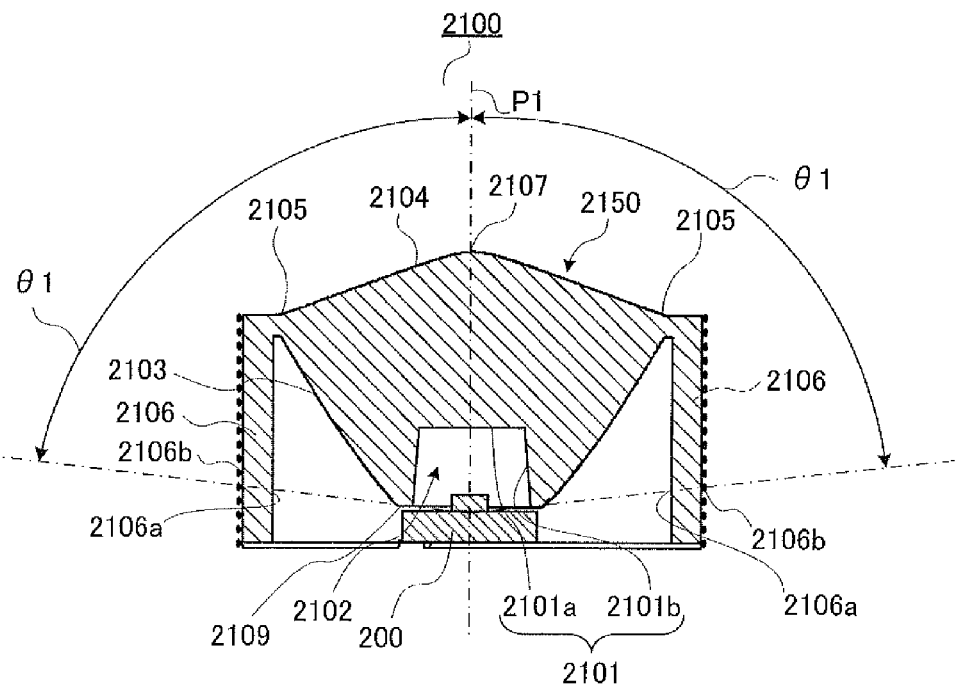
FIG. 21 is a cross-sectional view of a light-emitting device according to Embodiment 5 of the present invention.

The configuration of light-emitting device 2100 will now be described in detail with reference to FIG. 21. FIG. 21 is a cross-sectional view of light-emitting device 2100 according to Embodiment 5 of the present invention.

Light-emitting device 2100 primarily includes flux control member 2150 and light-emitting element 200.

Flux control member 2150 is mounted on a substrate (not shown) such that center axis P1 is aligned with the optical axis of light-emitting element 200. Flux control member 2150 accommodates light-emitting element 200. Part of the light from light-emitting element 200 is incident on flux control member 2150 and part of the incident light is totally reflected. In this way, the total incident light is controlled to have a distribution narrower than the spreading light from the light-emitting element 200 and is incident on a target surface (not shown). Light emitted within an angular range $\theta > \theta_1$ from light-emitting element 200 is incident on flux control member 2150. Flux control member 2150 controls the light emitted within an angular range θ>θ1 such that the light has distribution characteristics that has a higher intensity in a large angular range from the optical axis than in a small angular range and that enables illumination of a target surface (not shown) near light-emitting element 200. Thus, flux control member 2150 can have a reduced entrance length.

Light-emitting element 200 is a light source, such as a white-light emitting diode. Light-emitting element 200 is mounted on the substrate such that its optical axis aligns with center axis P1 of flux control member 2150.

Configuration of Flux Control Member

The configuration of flux control member 2150 will now be described in detail.

Flux control member 2150 has first incident surface 2101, depression 2102, total-reflection surface 2103, first emission surface 2104, connecting portion 2105, flux control portion 2106, and apex 2107.

First incident surface 2101 constitutes the inner surface of depression 2102, which is formed on bottom surface 2109 facing light-emitting element 200 and is rotationally symmetrical about center axis P1. First incident surface 2101 has inner upper surface 2101a defining the inner surface of depression 2102 and tapered inner wall 2101b extending from the external edge of inner upper surface 2101a to the opening edge of depression 2102. The inner diameter of inner wall 2101b gradually increases from inner upper surface 2101a to the opening edge of depression 2102.

Total-reflection surface 2103 constitutes an external surface extending from the outer circumferential portion of bottom surface 2109 to the lower surface of connecting portion 2105 and is rotationally symmetrical about center axis P1. The total-reflection surface 2103 flares from the external edge of bottom surface 2109 toward the first emission surface 2104. The outer diameter gradually increases from bottom surface 2109 to connecting portion 2105. Total-reflection surface 2103 forms a convex arc-like curve with a profile line extending outward (away from center axis P1).

The projection of first emission surface 2104 on a flat surface is a circle with its center aligned with center axis P1. First emission surface 2104 has apex 2107 at a predetermined position along center axis P1 and extends from the apex 2107 to outer circumferential portion 2105 of first emission surface 2104 at a gentle slope such that the height from bottom surface 2109 gradually decreases. First emission surface 2104 is convex and protrudes upwards (away from bottom surface 2109).

Connecting portion 2105 integrates total-reflection surface 2103 and first emission surface 2104 with flux control portion 2106.

Flux control portion 2106 is disposed around the circumference of total-reflection surface 2103 so as to oppose total-reflection surface 2103. Flux control portion 2106 includes second incident surface 2106a and second emission surface 2106b, second incident surface 2106a being a roughened surface receiving light from light-emitting element 200 and light leaking from surfaces other than first emission surface 2104, second emission surface 2106b being a roughened surface defining the external wall of flux control member 2106 and emitting light incident on flux control portion 2106. Incident surface 2106a and emission surface 2106b of flux control portion 2106 according to this embodiment are parallel to the optical axis.

Bottom surface 2109 is a flat annular surface formed around the opening edge of depression 2102.

In light-emitting device 2100 having the configuration described above, part of the light from light-emitting element 200 is incident on first incident surface 2101, part of the incident light is reflected at total-reflection surface 2103, and the reflected light is controlled to be narrower than the spreading light from light-emitting element 200. Then, the light is emitted from first emission surface 2104 toward a target surface (not shown).

Light-emitting device 2100 guides light that is emitted from light-emitting element 200 at an angle within an angular range θ larger than the maximum angle θ1 to the optical axis of the light incident on first incident surface 2101 and that is not incident on first incident surface 2101, toward flux control member 2106. Unlike the distribution characteristics of the light from first emission surface 2104, the distribution characteristics of the light incident on flux control portion 2106 is controlled by light-emitting device 2100 such that the intensity is higher in a large angular range from the optical axis than in a small angular range and such that the light is incident on a target surface (not shown) near light-emitting element 200, and the controlled light is emitted. Thus, light-emitting device 2100 can reduce the entrance length compared to a case where only light from first emission surface 2104 is incident on the target surface.

The configuration of illumination apparatus according to this embodiment is the same as the configurations illustrated in FIGS. 7, 8, and 15, except that light-emitting devices 100-1 to 100-6 in FIGS. 7 and 8 or light-emitting devices 1100-1 to 1100-6 in FIG. 15 are replaced by light-emitting devices 2100-1 to 2100-6, having the same configuration as that of light-emitting device 2100, without repeated descriptions.

Advantageous Effects of this Embodiment

According to this embodiment, an emission surface that differs from an emission surface that emits light with a narrowed distribution and that has distribution characteristics of illuminating an area near the light source can enhance the illuminance near the light source and reduce the entrance length.

An illumination apparatus according to this embodiment for internal illumination illuminating a target surface from the interior allows the target surface to have a thin frame. This can increase the flexibility in the area on the target surface in which characters and/or illustrations are depicted.

The distance can be small between the target surface and the light source in the illumination apparatus according to this embodiment for external illumination illuminating a target surface from the exterior, reducing the size and thickness of the illumination apparatus, thus reducing the installation space of the illumination apparatus.

According to this embodiment, a flux control member having emission surfaces each having different distribution characteristics comprises a single component. Thus, the number of components and the manufacturing costs can be reduced.

Modification of this Embodiment

Figure 22:
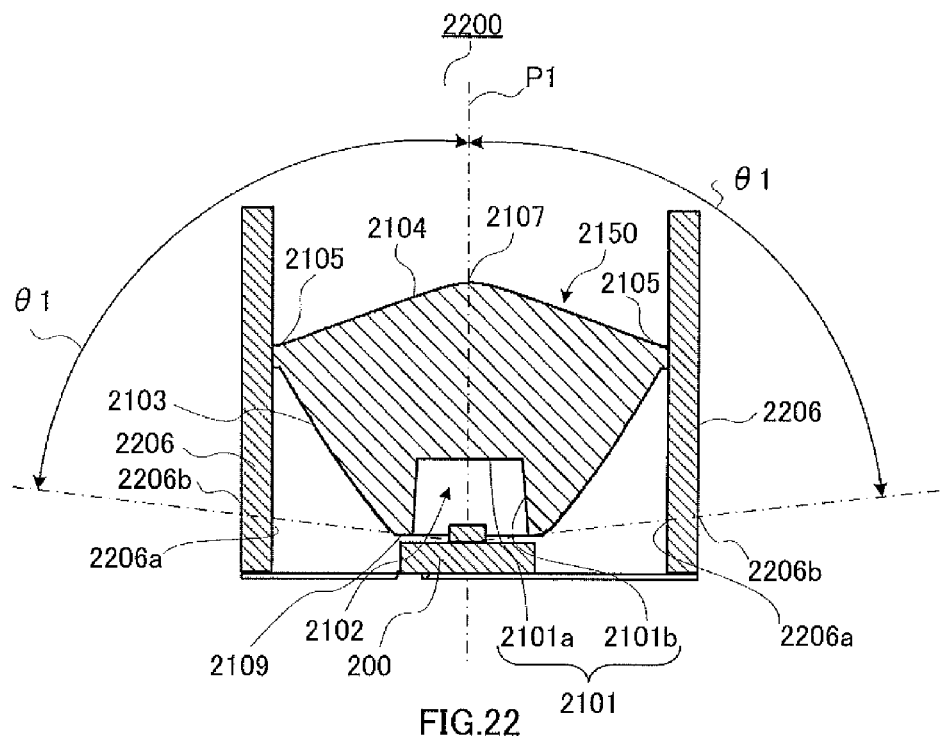
FIG. 22 is a cross-sectional view of a light-emitting device according to a first modification of Embodiment 5 of the present invention.

The configuration of the flux control member according to this embodiment may be that illustrated in FIG. 22 instead of that illustrated in FIG. 21 and otherwise. FIG. 22 is a cross-sectional view of a first modification of light-emitting device 2200 according to this embodiment.

Light-emitting device 2200 illustrated in FIG. 22 is the same as light-emitting device 2100 illustrated in FIG. 21, except that flux control portion 2206 is provided instead of flux control portion 2106. In light-emitting device 2200 in FIG. 22, the same elements as those in light-emitting device 2100 in FIG. 21 will be designated by the same reference numerals, without repeated descriptions.

Flux control portion 2206 is disposed around the circumference of total-reflection surface 2103 so as to oppose total-reflection surface 2103. Flux control portion 2206 includes second incident surface 2206a and second emission surface 2206b, second incident surface 2206a being a roughened surface receiving light from light-emitting element 200 and light leaking from surfaces other than first emission surface 2104, second emission surface 2206b being a roughened surface defining the external wall of flux control portion 2206 and emitting light incident on flux control portion 2206. Second incident surface 2206a and second emission surface 2206b of flux control portion 2206 according to this embodiment are disposed parallel to the optical axis. According to a modification of this embodiment, an extension is disposed such that flux control portion 2206 is higher than the external edge of first emission surface 2104. The extension serves as top panel 124 according to Embodiment 1. As a result, part of the light from first emission surface 2104 reaches the target surface through the extension.

Connecting portion 2105 of light-emitting device 2200 connects total-reflection surface 2103, first emission surface 2104, and flux control portion 2206 substantially in the center of flux control portion 2206.

The distribution characteristics of light-emitting device 2200 are the same as the distribution characteristics of light-emitting device 2100. Thus, the description thereon is not repeated.

In light-emitting device 2100 or light-emitting device 2200, second incident surface 2106a or 2206a and second emission surface 2106b or 2206b of flux control portion 2106 or 2206 are disposed parallel to the optical axis. This embodiment is not limited thereto, and otherwise may have at least one of second incident surface 2206a and second emission surface 2206b of flux control portion 2206 tilting such that the lower end is closer to the optical axis than the upper end.

Figure 23:
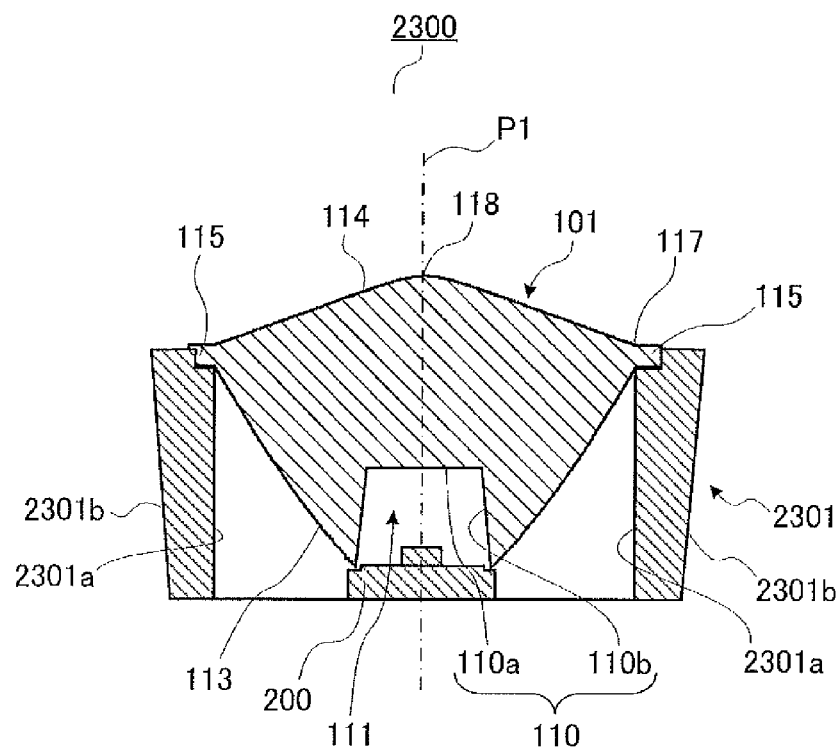
FIG. 23 is a cross-sectional view of a light-emitting device according to a second modification of Embodiment 5 of the present invention.
Figure 24:
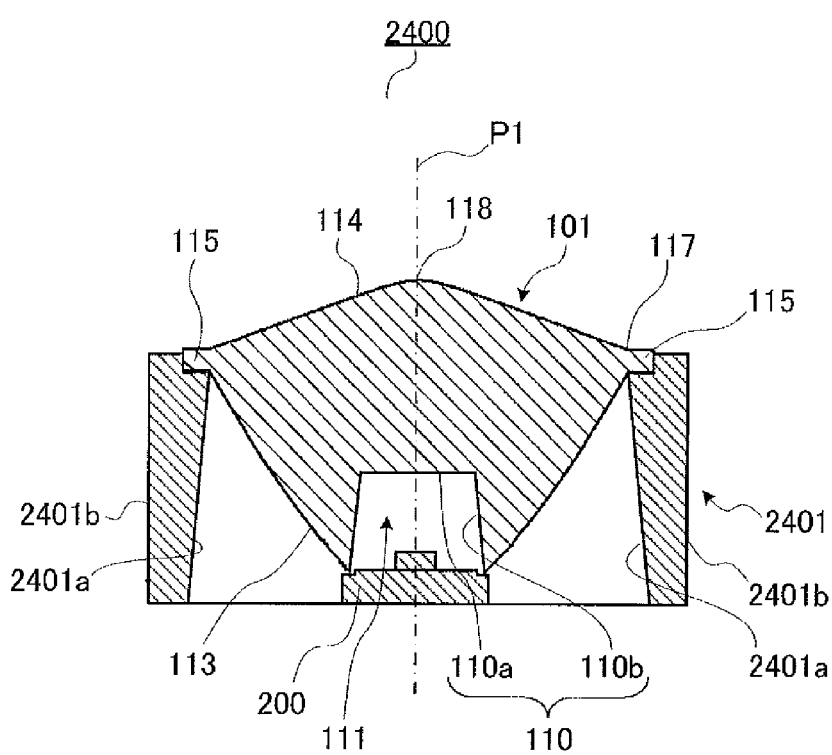
FIG. 24 is a cross-sectional view of a light-emitting device according to a third modification of Embodiment 5 of the present invention.
Figure 25:
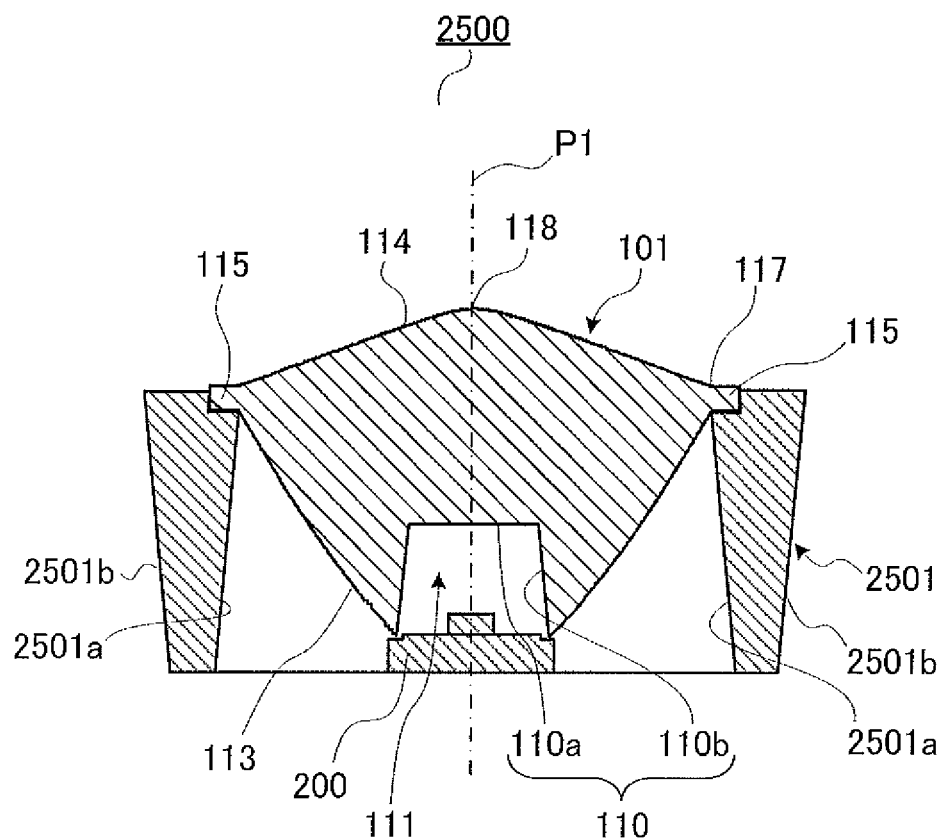
FIG. 25 is a cross-sectional view of a light-emitting device according to a fourth modification of Embodiment 5 of the present invention.

The configuration of the flux control member according this embodiment is not limited to that depicted in FIG. 21 or 22 and otherwise may have any configuration illustrated in FIGS. 23 to 25. FIG. 23 is a cross-sectional view of a second modification of the light-emitting device according to this embodiment. FIG. 24 is a cross-sectional view of a third modification of the light-emitting device according to this embodiment. FIG. 25 is a cross-sectional view of a fourth modification of the light-emitting device according to this embodiment. In FIGS. 23 to 25, the same elements as those in FIGS. 1A to 6B will be designated by the same reference numerals, without repeated descriptions.

If the top panel is not required, the second flux control member according to any one of Embodiments 1 to 4 may have integrate first flux control member and second flux control member not having a top panel. In such a case, the first flux control member and the second flux control member may be integrated at their engaging parts. Thus, resilient portions are not required.

Specifically, light-emitting device 2300 illustrated in FIG. 23 includes second flux control member 2301 and light-emitting element 200.

Second flux control member 2301 is disposed around the circumference of total-reflection surface 113 so as to oppose total-reflection surface 113. Second flux control member 2301 includes second incident surface 2301a and second emission surface 2301b, second incident surface 2301a being a roughened surface receiving light from light-emitting element 200 and light leaking from surfaces other than first emission surface 114, second emission surface 2306b being a roughened surface defining the external wall of second flux control member 2301 and emitting light incident on second incident surface 2301a. Flange 115 of first flux control member 101 is fixed to the upper edge of second incident surface 2301a of second flux control member 2301 with an adhesive or by welding. Second incident surface 2301a and second emission surface 2301b may be unroughened.

Second incident surface 2301a is disposed parallel to the optical axis such that it is rotationally symmetrical about the optical axis (center axis P1).

Second emission surface 2301b is rotationally symmetrical about the optical axis and tilts such that the lower end is closer to the optical axis than the upper end.

The distribution characteristics of light-emitting device 2300 are the same as the distribution characteristics according to Embodiment 2. Thus, the description thereon is not repeated.

Light-emitting device 2400 illustrated in FIG. 24 includes second flux control member 2401 and light-emitting element 200.

Second flux control member 2401 is disposed around the circumference of total-reflection surface 113 so as to oppose total-reflection surface 113. Second flux control member 2401 includes second incident surface 2401a and second emission surface 2401b, second incident surface 2401a being a roughened surface receiving light from light-emitting element 200 and light leaking from surfaces other than first emission surface 114, second emission surface 2401b being a roughened surface defining the external wall of second flux control member 2401 and emitting light incident on second incident surface 2401a. Flange 115 of first flux control member 101 is fixed to the upper edge of second incident surface 2401a of second flux control member 2401 with an adhesive or by welding. Second incident surface 2401a and second emission surface 2401b may be unroughened.

Second incident surface 2401a is rotationally symmetrical about the optical axis (center axis P1) and tilts in such a manner that the lower end is further away from the optical axis than the upper end.

Second emission surface 2401b is disposed parallel to the optical axis so as to be rotationally symmetrical about the optical axis (center axis P1).

The distribution characteristics of light-emitting device 2400 are the same as the distribution characteristics according to Embodiment 3. Thus, the description thereon is not repeated.

Light-emitting device 2500 illustrated in FIG. 25 includes second flux control member 2501 and light-emitting element 200.

Second flux control member 2501 is disposed around the circumference of total-reflection surface 113 so as to oppose total-reflection surface 113. Second flux control member 2501 includes second incident surface 2501a and second emission surface 2501b, second incident surface 2501a being a roughened surface receiving light from light-emitting element 200 and light leaking from surfaces other than first emission surface 114, second emission surface 2501b being a roughened surface defining the external wall of second flux control member 2501 and emitting light incident on second incident surface 2501a. Flange 115 of first flux control member 101 is fixed to the upper edge of second incident surface 2501a of second flux control member 2501 with an adhesive or by welding. Second incident surface 2501a and second emission surface 2501b may be unroughened.

Second incident surface 2501a is rotationally symmetrical about the optical axis (center axis P1) and tilts in such a manner that the lower end is further away from the optical axis than the upper end.

Second emission surface 2501b is rotationally symmetrical about the optical axis and tilts in such a manner that the lower end is closer to the optical axis than the upper end.

The distribution characteristics of light-emitting device 2500 are the same as the distribution characteristics according to Embodiment 4. Thus, the description thereon is not repeated.

Embodiment 6

Figure 26:
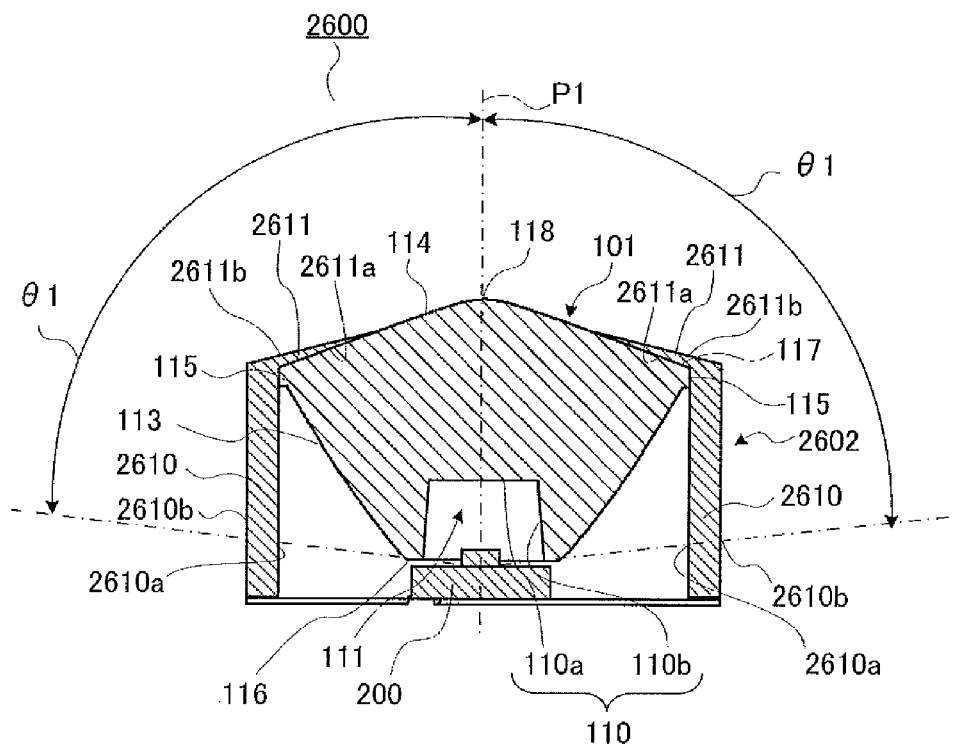
FIG. 26 is a cross-sectional view of a light-emitting device according to Embodiment 6 of the present invention.

FIG. 26 is a cross-sectional view of light-emitting device 2600 according to Embodiment 6 of the present invention. In FIG. 26, the same elements as those in FIGS. 1A to 6B will be designated by the same reference numerals, without repeated descriptions.

Second flux control member 2602 includes flux control portion 2610 and top panel 2611.

Flux control portion 2610 is a hollow cylinder. Flux control portion 2610 includes second incident surface 2610a and second emission surface 2610b, second incident surface 2610a being disposed parallel to the optical axis such that it is rotationally symmetrical about the optical axis, second emission surface 2610b being disposed parallel to the optical axis such that it is rotationally symmetrical about the optical axis.

Top panel 2611 protrudes inward like a roof from the upper edge of cylindrical flux control portion 2610 and has an annular shape defining opening 125. Top panel 2611 covers part of first emission surface 114 from outer circumferential portion 117 of first emission surface 114 of first flux control member 101 to a predetermined length when first flux control member 101 is accommodated, and includes third incident surface 2611a and third emission surface 2611b, third incident surface 2611a receiving light from covered first emission surface 114, third emission surface 2611b emitting light incident on third incident surface 2611a and transmitted through top panel 2611. The light from third emission surface 2611b is combined with the part of the light from the first emission surface 114 not covered with third incident surface 2611b and is incident on the target surface (not shown). The thickness of top panel 2611 between third incident surface 2611a and third emission surface 2611b decreases toward the tip (opening 125). Top panel 2611 may be colored with a color correcting materials, such as a fluorescent material or a colorant, may contain a scattering material for light scattering, and/or may have roughened third emission surface 2611b so as to emit adjusted light that allows the color and the illuminance distribution to be corrected on target portion 701 of a combination of light transmitted through top panel 2611 and light emitted from first emission surface 114 not covered with top panel 2611. For example, top panel 2611 contains a fluorescent material that corrects the yellow light from yellowish first emission surface 114 to substantially white light. The configuration of top panel 2611 is not limited to one internally containing the adjustment materials. Instead, third emission surface 2611b may be coated with paint containing an adjustment material, such as a fluorescent material, or may be covered with a sheet.

In light-emitting device 2600 having the configuration described above, part of the light from first emission surface 114 is incident on incident surface 2611a, and the incident light is controlled to have distribution characteristics different from the distribution characteristics of the light from first emission surface 114 and is emitted from third emission surface 2611b. The distribution characteristics of the light from flux control portion 2610 are the same as the distribution characteristics according to Embodiment 1. Thus, the description thereon is not repeated.

According to this embodiment, light from the emission surface is incident on the top panel, the light incident on the top panel is controlled to have distribution characteristics different from the distribution characteristics of light from the emission surface, and the controlled light is emitted. According to this embodiment, in addition to the advantageous effects of Embodiment 1, light emitted with a narrow distribution to illuminate the target surface at an oblique angle can illuminate an area near the light-emitting element, and the entrance length can be decreased.

According to this embodiment, the top panel containing a color correction substance and/or a scattering material for color correction of emission light can control the color and scattering of light illuminating the target surface and prevent variations in color and illumination on the target surface.

According to this embodiment, the second flux control member may be composed of a material containing a color correction substance and/or scattering material, and components other than the top panel may also contain a color correction substance and/or a scattering material.

Embodiment 7

Configuration of Light-emitting Device

Figure 27:
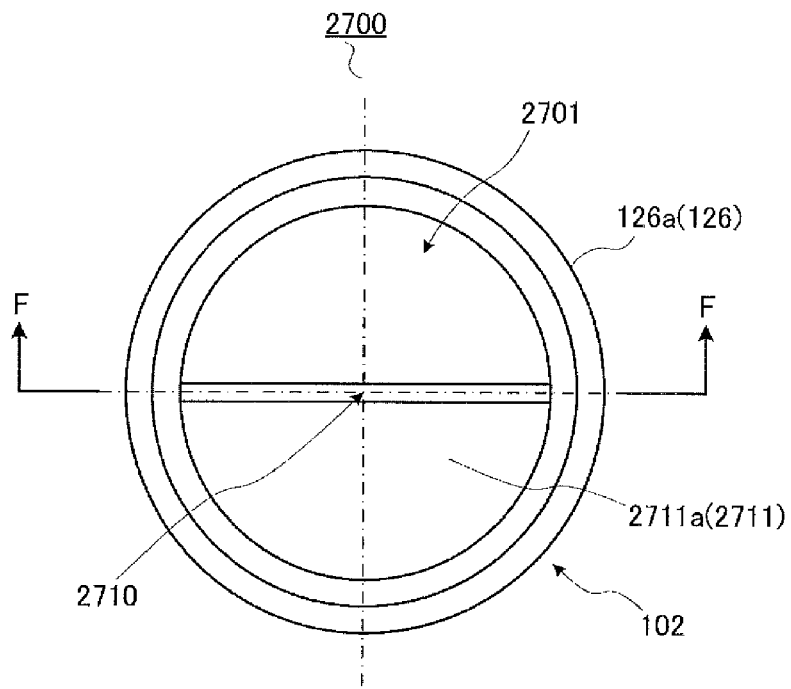
FIG. 27 is a plan view of a light-emitting device according to Embodiment 7 of the present invention.
Figure 28:
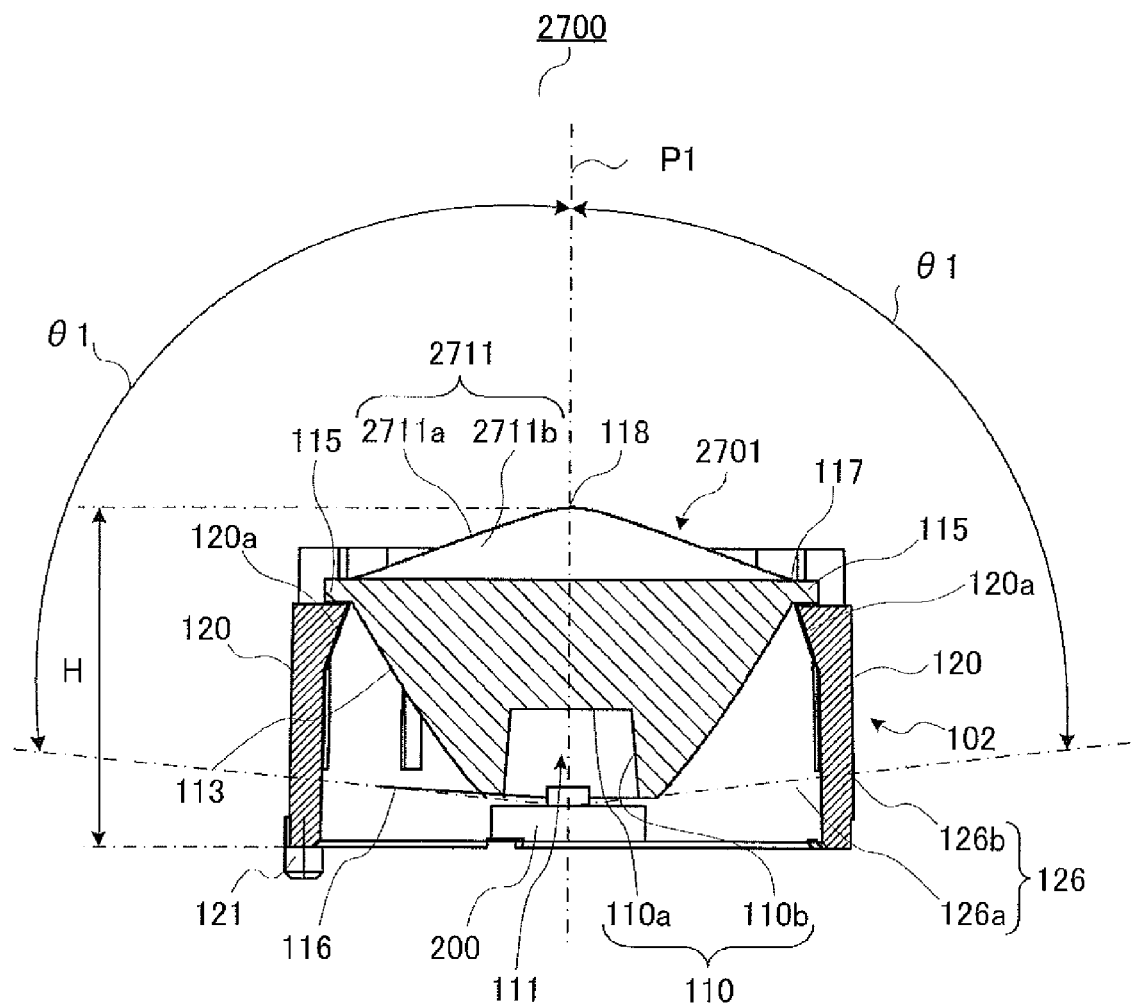
FIG. 28 is a cross-sectional view taken along line F-F in FIG. 27.

The configuration of light-emitting device 2700 will now be described in detail. FIG. 27 is a plan view of light-emitting device 2700 according to Embodiment 7 of the present invention. FIG. 28 is a cross-sectional view taken along line F-F in FIG. 27. In FIGS. 27 and 28, the same elements as those in FIGS. 1A to 6B will be designated by the same reference numerals, without repeated descriptions.

First flux control member 2701 includes first incident surface 110, depression 111, total-reflection surface 113, flange 115, bottom surface 116, slit 2710, and first emission surface 2711.

Slit 2710 is a groove extending from one end to another end of a straight line passing through center axis P1 on first emission surface 2711, having a circular projection on a flat surface, and from the upper end to a height equal to the flange 115.

First emission surface 2711 has a circular projection on a flat surface. First emission surface 2711 includes top-panel emission surfaces 2711a that tilt from center axis P1 toward outer circumferential portion 117 and are convex protruding upward. First emission surface 2711 includes roughened sidewall emission surfaces 2711b that oppose each other across slit 2710 and are flat surfaces parallel to center axis P1.

Light-emitting device 2700 having the configuration described above scatters light from sidewall emission surfaces 2711b and emits the scattered light to illuminate a target surface having a height H (see FIG. 28) from the bottom surface of second flux control member 102 to sidewall emission surface 2711b and its vicinity. The distribution characteristics of light from top-panel emission surface 2711a and light from second flux control member 102 are the same as the distribution characteristics according to Embodiment 1. Thus, the description thereon is not repeated.

Configuration of Illumination Apparatus

The configuration of illumination apparatus 2900 will now be described in detail.

Figure 29:
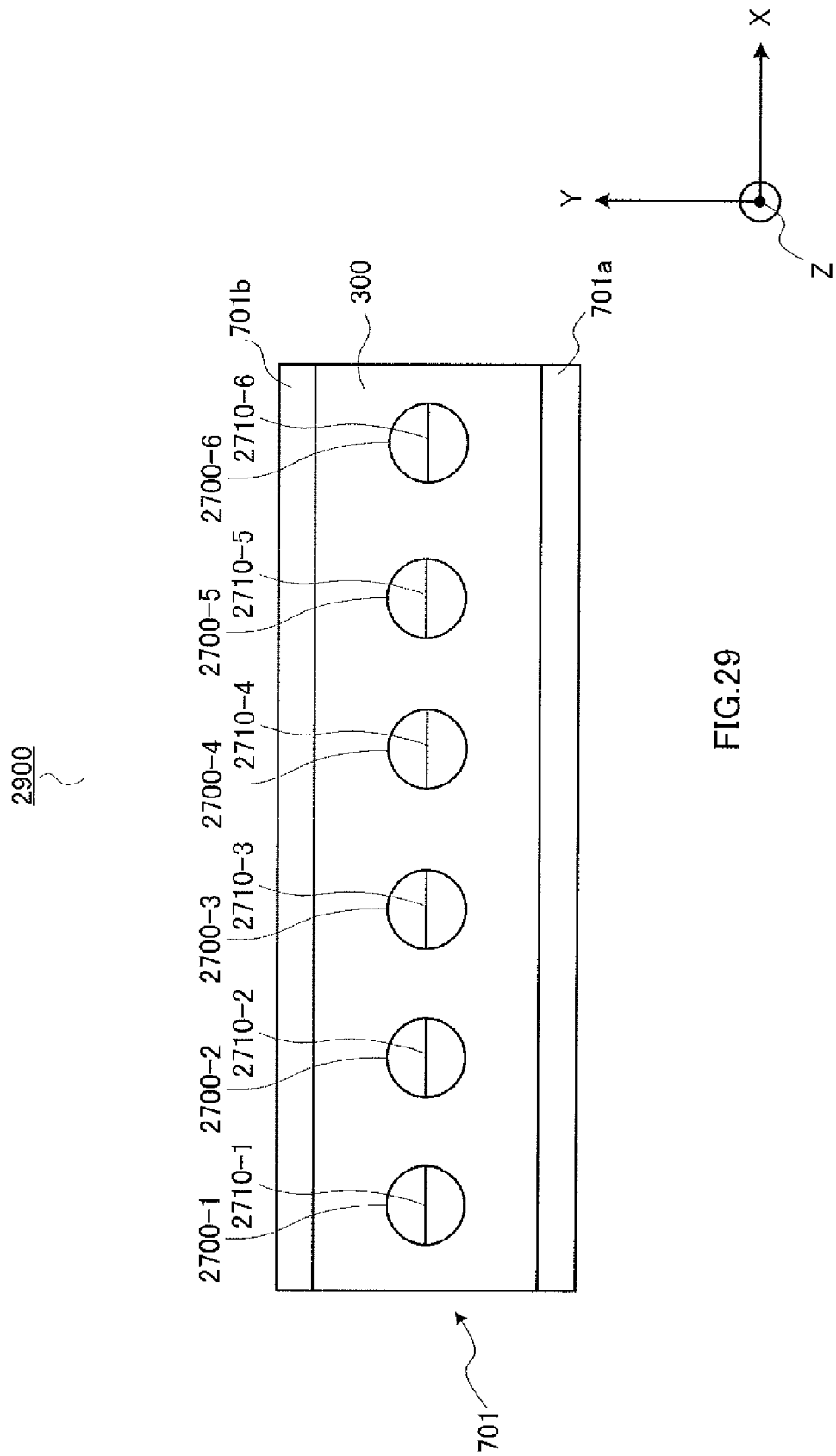
FIG. 29 is a plan view of an illumination apparatus according to Embodiment 7 of the present invention.

FIG. 29 is a plan view of illumination apparatus 2900 according to Embodiment 7 of the present invention.

Illumination apparatus 2900 illustrated in FIG. 29 is the same as the configuration of illumination apparatus 700 according to Embodiment 1 illustrated in FIGS. 7 and 8, except that light-emitting devices 100-1 to 100-6 are replaced by light-emitting devices 2700-1 to 2700-6. In FIG. 29, the same elements as those in FIGS. 7 and 8 will be designated by the same reference numerals, without repeated descriptions. Only slits 2710-1 to 2710-6 are depicted in light-emitting devices 2700-1 to 2700-6 in FIG. 29 for explanatory purposes.

Illumination apparatus 2900 primarily includes light-emitting devices 2700-1 to 2700-6, substrate 300, and target portion 701. The configuration of light-emitting devices 2700-1 to 2700-6 is the same as the configuration of light-emitting device 2700 in FIGS. 27 and 28. Thus, the detailed description thereon is not repeated.

Light-emitting devices 2700-1 to 2700-6 are aligned on substrate 300 at predetermined intervals along the X-axis, or the longitudinal direction of illumination apparatus 2900. Light-emitting devices 2700-1 to 2700-6 are disposed on substrate 300 such that the longitudinal direction (horizontal direction in FIG. 29) of slits 2710-1 to 2710-6 is parallel to the X-axis.

Light-emitting devices 2700-1 to 2700-6 are mounted on substrate 300 at predetermined intervals along a direction parallel to the X-axis. Substrate 300 is disposed on the bottom surface of illumination apparatus 2900.

Target surface 701a, which is parallel to the X-Z plane, is decorated with, for example, characters and/or illustrations for advertisement and is illuminated from an oblique angle with light from the interior of light-emitting devices 2700-1 to 2700-6.

Opposing target surface 701b, which opposes target surface 701a and is parallel to the target surface 701a and the X-Z plane, is decorated with, for example, characters and/or illustrations for advertisement and is illuminated at an oblique angle with light from the interior by light-emitting devices 2700-1 to 2700-6.

In illumination apparatus 2900 having the configuration described above, two sidewall emission surfaces 2711b, which oppose each other across slits 2710-1 to 2710-6, oppose target surface 701a or opposing target surface 701b. The area near height H of target surface 701a and opposing target surface 701b illuminated by sidewall emission surface 2711b can enhance the illuminance of the area near light-emitting element 200 and reduce the entrance length. A reduced entrance length can reduce the thickness of the frames of target surface 701a and opposing target surface 701b.

Illumination apparatus 2900 illustrated in FIG. 29 for internal illumination illuminates target portion 701 from the interior. However, the present invention is not limited thereto and may provide external illumination to illuminate a target portion from the exterior. In external illumination, the characters and/or illustrations on target surface 701a may be illuminated by light-emitting devices 2700-1 to 2700-6 from the exterior.

According to this embodiment, in addition to the advantageous effects of Embodiment 1, an emission surface having a cross-section parallel to the target surface is added to the first emission surface to enhance the illuminance of the target surface near the light source.

Embodiment 8

Figure 30:
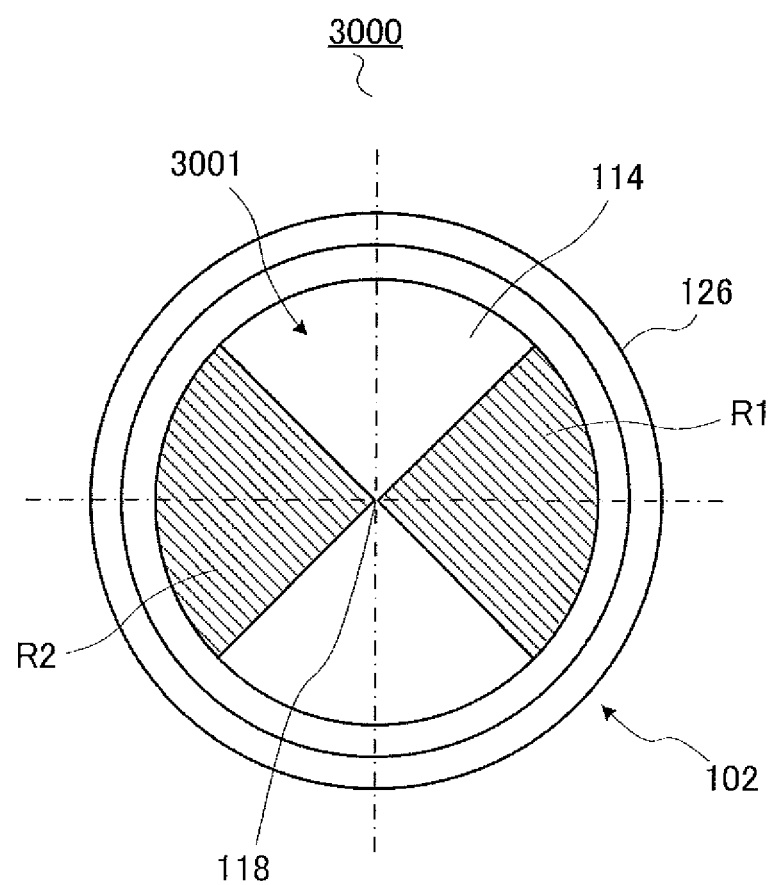
FIG. 30 is a plan view of a light-emitting device according to Embodiment 8 of the present invention.

FIG. 30 is a plan view of light-emitting device 3000 according to Embodiment 8 of the present invention. In FIG. 30, the same elements as those in FIGS. 1A to 6B will be designated by the same reference numerals, without repeated descriptions.

In first flux control member 3001, first emission surface 114 having a circular projection on a flat surface is quartered by equal degrees and quartered regions R1 and R2 that are symmetrical across center axis P1 are roughened.

As a result, scattered light is emitted from regions R1 and R2 of first emission surface 114, illuminating a target surface and its vicinity to a height substantially the same as first emission surface 114.

Other configurations are the same as those according to Embodiment 1. Thus, the description thereon is not repeated. The configuration of illumination apparatus according to this embodiment is the same as the configurations illustrated in FIGS. 7, 8, and 15, except that light-emitting devices 100-1 to 100-6 in FIGS. 7 and 8 or light-emitting devices 1100-1 to 1100-6 in FIG. 15 are replaced by light-emitting devices 3000-1 to 3000-6, having the same configuration as that of light-emitting device 3000, without repeated descriptions.

According to this embodiment, part of first emission surface 114 of the first flux control member is roughened, and the roughened area is disposed on the X-axis in FIGS. 7 and 8. According to this embodiment, in addition to the advantageous effects of Embodiment 1, an area near the light source can be illuminated with part of the light from the first flux control member, and the illuminance can be increased on a target surface near the light source.

Embodiment 9

Figure 31:
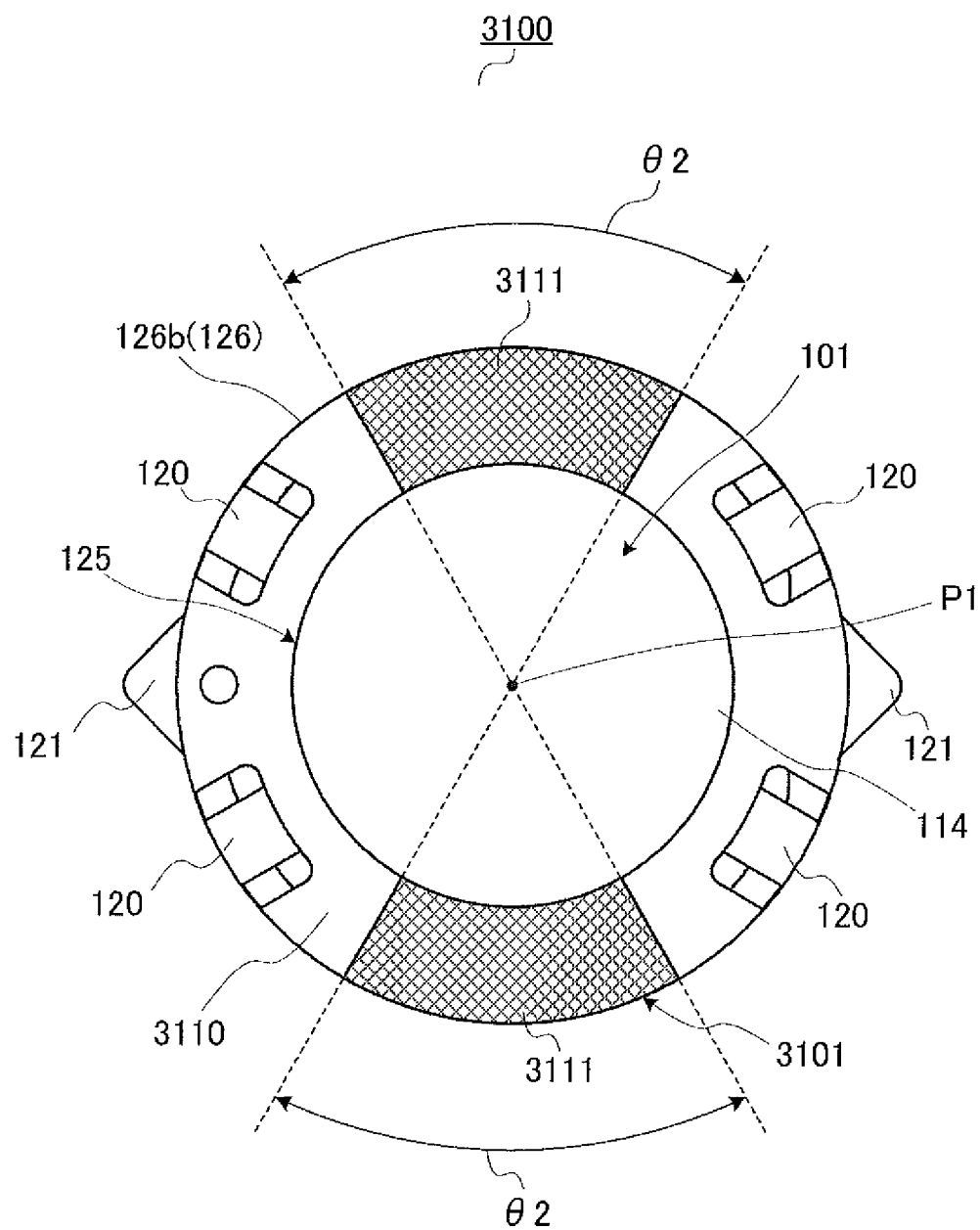
FIG. 31 is a plan view of a light-emitting device according to Embodiment 9 of the present invention.

FIG. 31 is a plan view of light-emitting device 3100 according to Embodiment 9 of the present invention. In FIG. 31, the configuration of first flux control member 101 is the same as that illustrated FIGS. 1A to 6B. Thus, the description thereon is not repeated.

Configuration of Second Flux Control Member

Second flux control member 3101 includes resilient portions 120, fixed portions 121, opening 125, flux control portion 126, and top panel 3110. In FIG. 31, the same elements as those in FIGS. 1A to 6B will be designated by the same reference numerals, without repeated descriptions.

Top panel 3110 protrudes inward like a roof from the upper edge of cylindrical flux control portion 126 and has an annular shape defining opening 125. The lower surface of top panel 3110 comes into contact with the upper surface of flange 115 when first flux control member 101 is accommodated, inhibiting upward movement of first flux control member 101. Top panel 3110 cooperates with resilient portions 120 to fix first flux control member 101 inside second flux control member 102. Top panel 3110 covers part of the external edge portion of first emission surface 114. Top panel 3110 includes a pair of roughened portions 3111, which are roughened more than other areas of top panel 3110. Light-emitting device 3100 according to this embodiment is disposed between a pair of target portions 701, which oppose each other, and constitutes illumination apparatus 3200. The configuration of illumination apparatus 3200 will be described in detail below. Light that would form distinctly bright areas on the pair of target portions 701 is diffused by a pair of roughed portions 3111 in top panel 3110, covering part of first emission surface 114 from which the light is emitted. That is, roughed portions 3111 are first emission surface 114 intersecting an imaginary plane containing center axis P1 and orthogonal to target surfaces 701a and 701b, which are the incident sides of target portions 701, and are disposed near target surfaces 701a and 701b. Roughed portions 3111 are disposed in ranges defined by turning the intersecting line of the imaginary plane and top panel 3110 around center axis P1, which is the axis of rotation, by ±θ2/2. Roughed portions 3111 are roughened more than areas of top panel 3110 defined by turning the intersecting line by ±90° (see FIG. 31).

Configuration of Illumination Apparatus

The configuration of illumination apparatus 3200 will now be described in detail.

Figure 32:
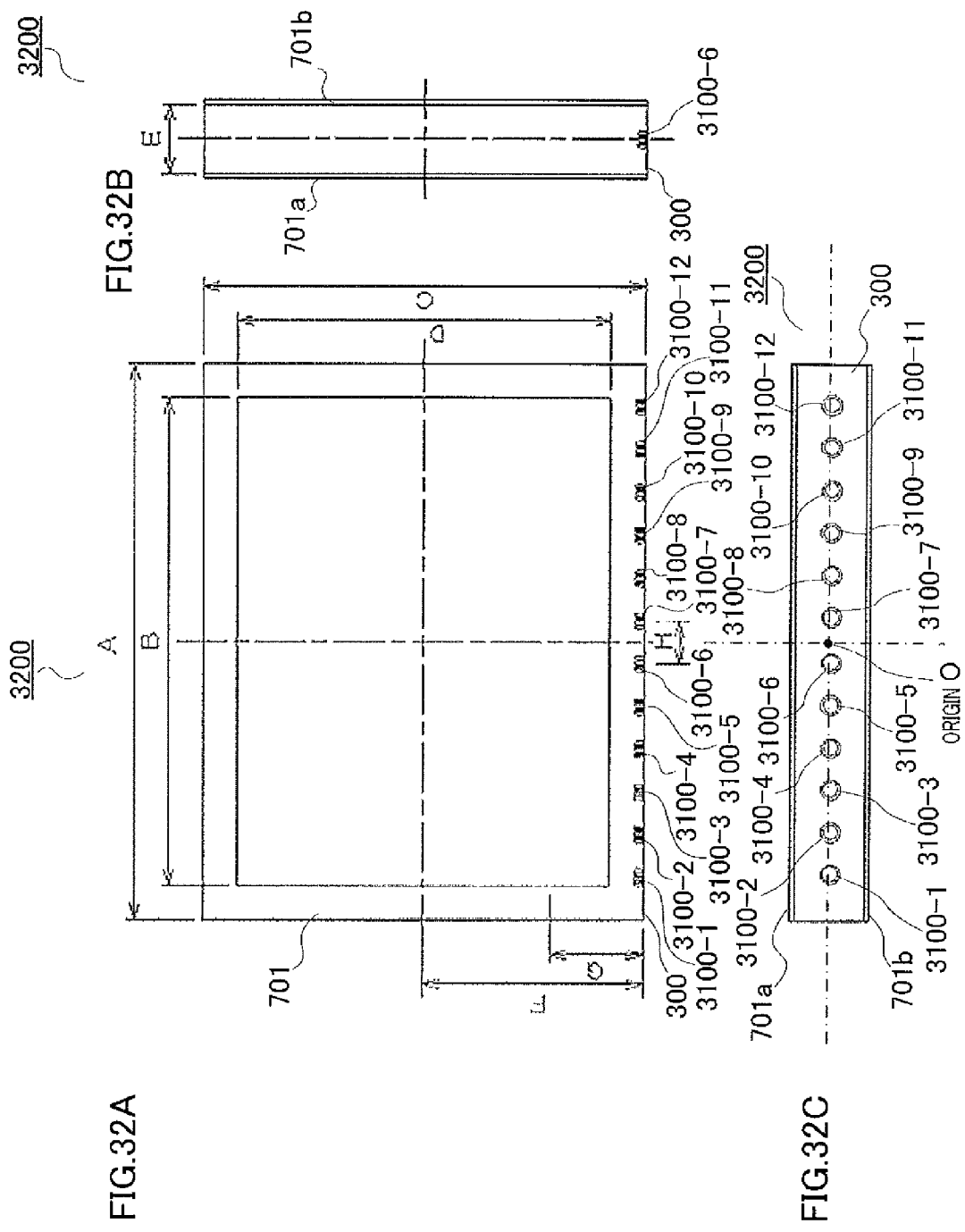
FIG. 32 is a plan view of an illumination apparatus according to Embodiment 9 of the present invention.

FIG. 32 is a plan view of illumination apparatus 3200. FIG. 32A is a front view; FIG. 32B is a cross-sectional side view; and FIG. 32C is a bottom view.

Illumination apparatus 3200 primarily includes light-emitting devices 3100-1 to 3100-12, substrate 300, and target portion 701. The configuration of light-emitting devices 3100-1 to 3100-12 is the same as the configuration of light-emitting device 3100 in FIG. 31. Thus, the description thereon is not repeated.

Light-emitting devices 3100-1 to 3100-12 are mounted on substrate 300 at predetermined intervals along a direction parallel to the X-axis, or the longitudinal direction of illumination apparatus 3200. Light-emitting devices 3100-1 to 3100-12 are disposed such that pairs of roughened portions 3111-1 to 3111-12 are disposed on the sides of target surface 701a and opposing target surface 701b.

Light-emitting devices 3100-1 to 3100-12 are mounted on substrate 300 at predetermined intervals in a direction parallel to the X-axis.

Light-emitting devices 3100-1 to 3100-12 illuminate target surface 701a from an oblique angle with light from the interior. The target surface 701a is disposed such that the light emitted from light-emitting devices 3100-1 to 3100-12 at a small angle to the optical axis is incident on target surface 701a at an angle larger than the light emitted at a large angle to the optical axis.

Light-emitting devices 3100-1 to 3100-12 illuminate target surface 701b from an oblique angle with light from the interior. The target surface 701b is disposed such that the light emitted from light-emitting devices 3100-1 to 3100-12 at a small angle to the optical axis is incident at an angle larger than the light emitted at a large angle to the optical axis.

According to this embodiment, substrate 300 is disposed on the XY-plane in XYZ orthogonal coordinates, and the twelve light-emitting devices 3100 are disposed along the X-axis at a pitch of 50 mm (length H=50 mm in FIG. 32A). Origin O in the XYZ orthogonal coordinates is positioned on substrate 300 between the sixth and seventh light-emitting devices 3100. One of the sides of target surface 701a and one of the sides of opposing target surface 701b are disposed on the XY-plane and parallel to a position ±40 mm in the Y-axis direction from the XZ-plane (length E=80 mm in FIG. 32B). The size of target portion 701, which includes the target surfaces 701a and 701b, is 650 mm in the X-axis direction (length A in FIG. 32A) and 520 mm in the Z-axis direction (length C in FIG. 32A). An effective light-emitting region is defined as a region 285 mm leftward and rightward and 220 mm upward and downward from the center of target portion 701 in FIG. 32A (distance B×distance D=570 mm×440 mm in FIG. 32A).

In illumination apparatus 3200 having the configuration described above, light from roughened portions 3111-1 to 3111-12 is diffused by roughened portions 3111-1 to 3111-12. This prevents the generation of bright areas on the target portion 701 near the light source.

Figure 33:
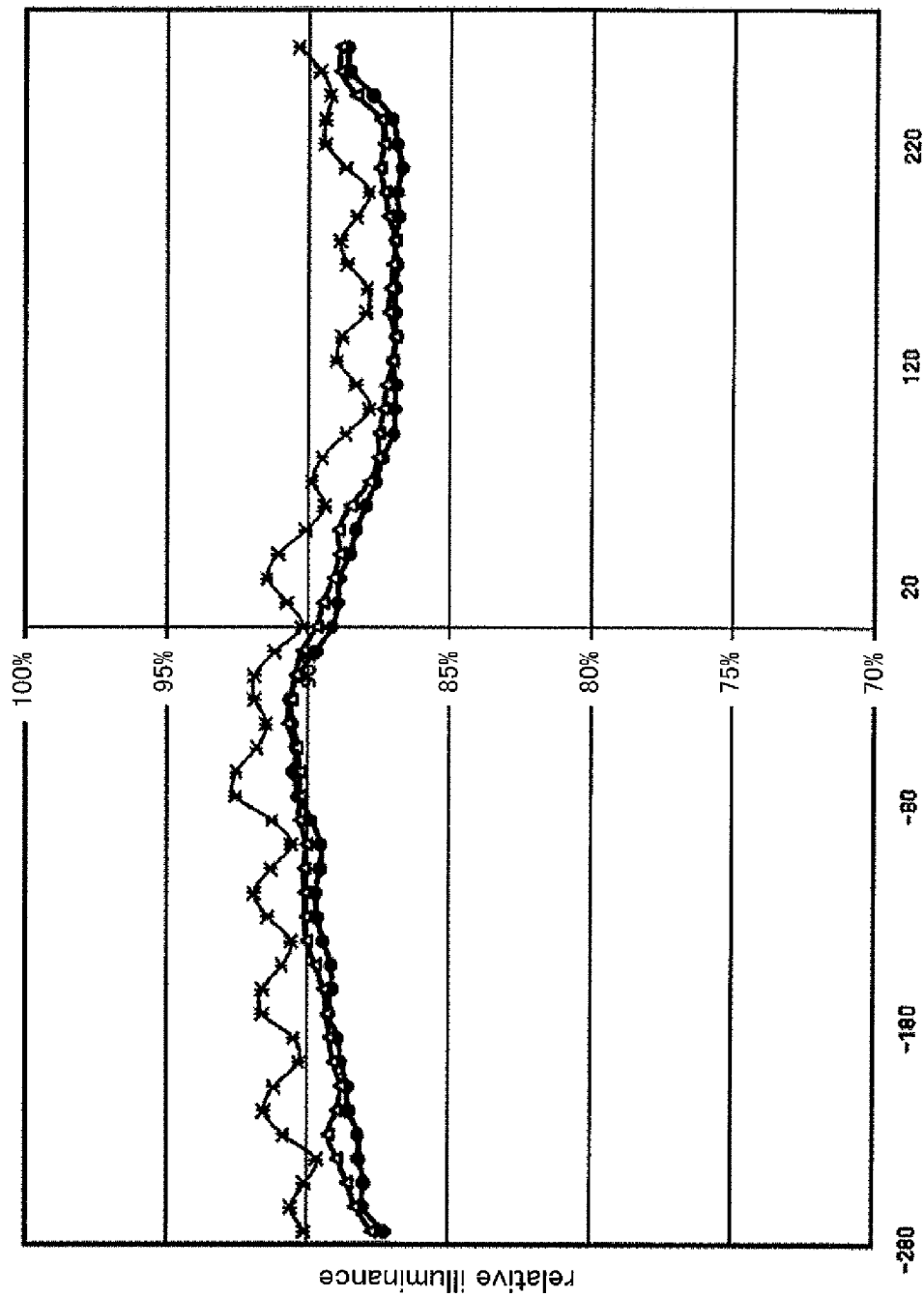
FIG. 33 illustrates the illuminance distribution on the emission side of an effective light-emitting region of a target surface of the illumination apparatus according to Embodiment 9 of the present invention.
Figure 34:
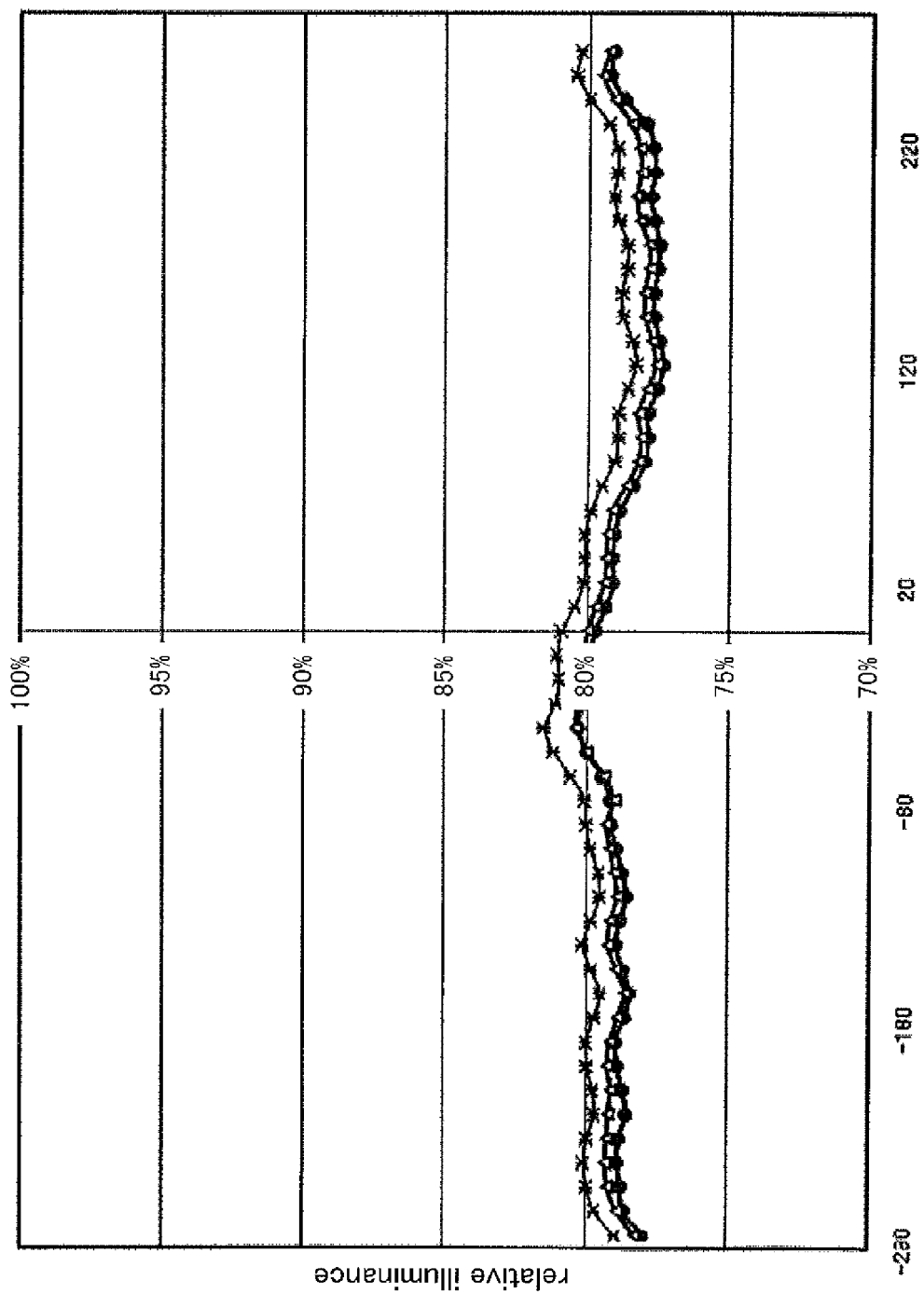
FIG. 34 illustrates the illuminance distribution on the emission side of the effective light-emitting region of the target surface of the illumination apparatus according to Embodiment 9 of the present invention.

FIGS. 33 and 34 illustrate illuminance distributions on the side of the light emission surface of effective light-emitting region in target portion 701 of illumination apparatus 3200. FIG. 33 illustrates the measurements of illuminance at 50 points disposed at an equal pitch along Z=110 mm (length G in FIG. 32A) on the light emission surface of target portion 701. FIG. 34 illustrates the measurements of illuminance at 50 points disposed at an equal pitch along Z=260 mm (length F in FIG. 32A) on the light emission surface of target portion 701. The vertical axis represents relative illuminance, which is the relative value of illuminance at each measurement point, where the maximum illuminance value in the effective light-emitting region is 100%. The horizontal axis represents the X-value at each measurement point. Asterisks (*) represent the results of light-emitting device 100 according to Embodiment 1; triangles (Δ) represent the results of light-emitting device 3100 according to Embodiment 9, where θ2=45'; and solid dots (•) represent the results of light-emitting device 3100 according to Embodiment 9, where θ2=60°. The angular range θ2 and roughness of roughened portions 3111-1 to 3111-6 can be set to desired values depending on the pitch of the light-emitting devices 3100 in the X-direction and the position of target surface 701a and opposing target surface 701b relative to light-emitting devices 3100. According to this embodiment, the illuminance on the light emission surface of target portion 701 tends to be higher with an angular range θ2 of 45° than 60° (see FIGS. 33 and 34). The influence of roughened portions 3111-1 to 3111-12 on the light emission surface of target portion 701 is small when the distance to the light source is large.

According to this embodiment, in addition to the advantageous effects of Embodiment 1, the roughened portions on the top panel of the second light flux control member can reduce the illuminance of the bright areas near the light source of the target portion, which causes variation in illuminance, and the uniform illuminance distribution of the target portion can be achieved.

According to this embodiment, roughened portions are formed on part of the top panel. Thus, the light from the top panel without the roughed portions and the first emission surface can illuminate areas on the target surface and the opposing target surface away from the light source with appropriate intensity.

According to this embodiment, roughened portions are formed by roughening part of the top panel of the second light flux control member. This embodiment is not limited thereto. Instead, a roughened sheet may be attached to part of the top panel to form a roughened portion. The roughness of the roughened portions may have a gradation. Part of the top panel can be roughed by carrying out processing such as etching, electrical discharging, or blasting on a metal mold and transferring this onto the surface of the second light flux control through molding.

Embodiment 10

Figure 35B:
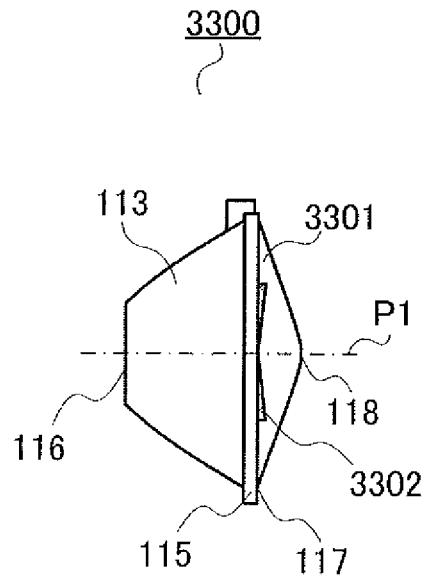
FIG. 35B is a side view of the first light flux control member according to Embodiment 10 of the present invention.
Figure 35A:
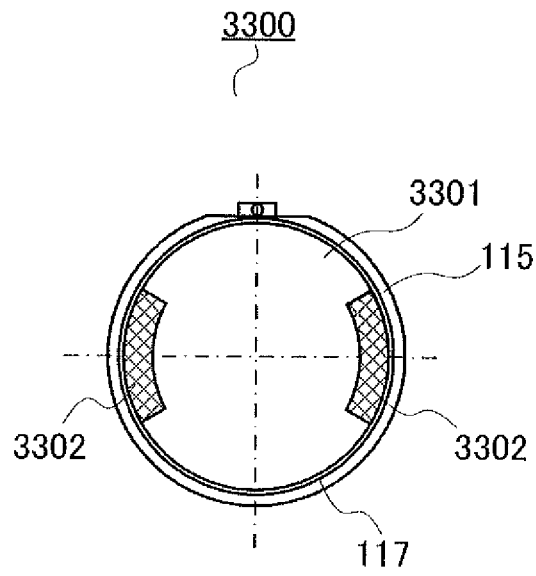
FIG. 35A is a plan view of a first light flux control member according to Embodiment 10 of the present invention.
Figure 35C:
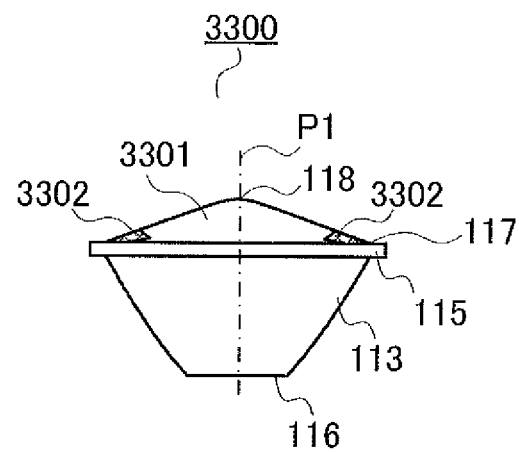
FIG. 35C is a front view of the first light flux control member according to Embodiment 10 of the present invention.

The configuration of first light flux control member 3300 will now be described in detail with reference to FIGS. 35A to 35C. FIG. 35A is a plan view of first light flux control member 3300 according to Embodiment 10 of the present invention. FIG. 35B is a side view of first light flux control member 3300 according to Embodiment 10 of the present invention. FIG. 35C is a front view of first light flux control member 3300 according to Embodiment 10 of the present invention. In FIG. 35, the same elements as those in FIGS. 1 to 6B will be designated by the same reference numerals, without repeated descriptions.

First light flux control member 3300 includes first incident surface 110 (omitted in FIG. 35), depression 111 (omitted in FIG. 35), total-reflection surface 113, flange 115, bottom surface 116, and first emission surface 3301.

The total-reflection surface 113 flares from the external edge of bottom surface 116 toward first emission surface 3301.

First emission surface 3301 has a projected circle with the center on center axis P1 in the projection of first light flux control member 3300 on a flat surface. First emission surface 3301 has apex 118 at a predetermined position along center axis P1 and extends from the apex 118 to outer circumferential portion 117 of first emission surface 3301 at a gentle slope such that the height from bottom surface 116 gradually decreases. First emission surface 3301 is convex and protrudes upwards (away from bottom surface 116). First emission surface 3301 has roughened portions 3302 roughened more than other areas of first emission surface 3301, along the outer circumferential portion 117 in contact with flange 115. A pair of roughened portions 3302 is formed on the first emission surface 3301. First flux control member 3300 according this embodiment is used in a similar manner as first flux control member 101 of light-emitting device 3100 of illumination apparatus 3200, which is described above. Light that would form distinctly bright areas on the pair of target portions 701 is diffused by the pair of roughed portions 3302, which is disposed on part of the first emission surface 3301 from which the light is emitted. That is, roughed portions 3302 are first emission surface 3301 intersecting an imaginary plane containing center axis P1 and orthogonal to target surfaces 701a and 701b, which are the incident sides of target portions 701, and are disposed near target surfaces 701a and 701b. Roughed portions 3302 are disposed in ranges defined by turning the intersecting line of the imaginary plane and first emission surface 3301 around center axis P1, which is the axis of rotation, by $\pm\theta2/2$. Roughed portions 3302 are formed as strips on the external edge portion of first emission surface 3301 and roughened more than areas of first emission surface 3301 defined by turning the intersecting line by $\pm 90°$ (see FIG. 35A).

Flange 115 protrudes radially outward from outer circumferential portion 117 of first emission surface 3301 and is substantially annular.

Outer circumferential portion 117 is formed around the outer circumference of first emission surface 3301 and connects with flange 115.

Apex 118 is positioned on center axis P1 and protrudes from first emission surface 3301.

First flux control member 3300 having the configuration described above is accommodated in second flux control member 102 illustrated in FIGS. 1A to 6B. In this embodiment, a light-emitting device includes first flux control member 3300 and second flux control member 102 accommodating first flux control member 3300.

In the illumination apparatus including the light-emitting devices described above, the light-emitting devices are disposed such that the pairs of roughened portions 3302 are disposed on the sides of target surface 701a and opposing target surface 701b, in such a manner similar to that illustrated in FIG. 32. In the illumination apparatus according to this embodiment, the configuration is the same as that illustrated in FIG. 32, except that the light-emitting devices each include first flux control member 3300 and second flux control member 102 accommodating first flux control member 3300. Thus, the description thereon is not repeated.

According to this embodiment, in addition to the advantageous effects of Embodiment 1, the roughened portions formed on part of the first emission surface of the first flux control member can reduce the illuminance of the bright areas near the light source of the target portion, which causes variation in illuminance, and can achieve the uniform illuminance distribution of the target portion.

According to this embodiment, roughened portions are formed on part of the first emission surface. Thus, the light from the first emission surface without the roughed portions can illuminate areas on the target surface and the opposing target surface away from the light source with appropriate intensity.

According to this embodiment, roughened portions are formed by roughening part of the first emission surface of the first light flux control member. This embodiment is not limited thereto. Instead, a roughened sheet may be attached to part of the first emission surface to form a roughened portion. The roughness of the roughened portions may have a gradation. Part of the first emission surface can be roughed by carrying out processing such as etching, electrical discharging, or blasting on a metal mold and transferring this onto the surface of the first light flux control member through molding.

Embodiment 11

Figure 36A:
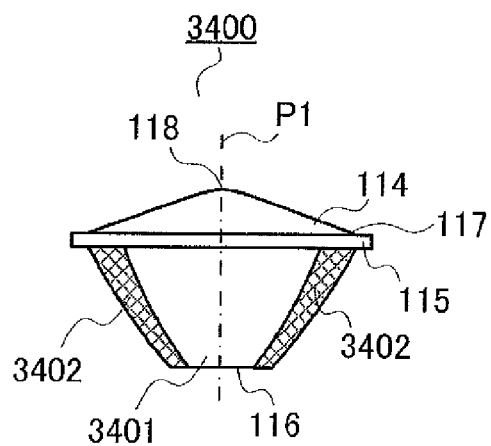
FIG. 36A is a front view of a first light flux control member according to Embodiment 11 of the present invention.
Figure 36B:
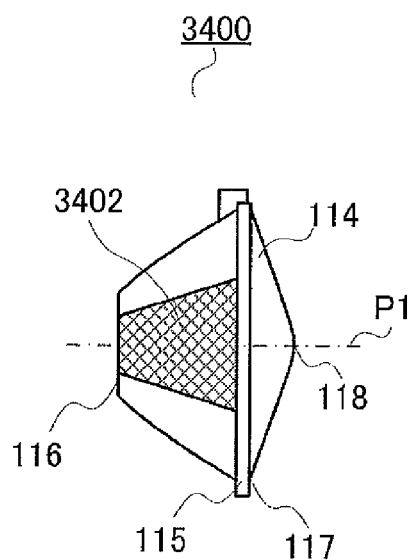
FIG. 36B is a side view of the first light flux control member according to Embodiment 11 of the present invention.
Figure 36C:
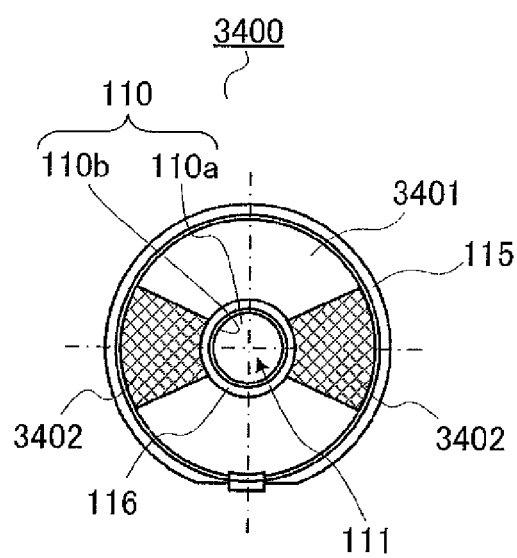
FIG. 36C is a bottom view of the first light flux control member according to Embodiment 11 of the present invention.

The configuration of first light flux control member 3400 will now be described in detail with reference to FIGS. 36A to 36C. FIG. 36A is a front view of first light flux control member 3400 according to Embodiment 11 of the present invention. FIG. 36B is a side view of first light flux control member 3400 according to Embodiment 11 of the present invention. FIG. 36C is a bottom view of first light flux control member 3400 according to Embodiment 11 of the present invention. In FIG. 36, the same elements as those in FIGS. 1A to 6B will be designated by the same reference numerals, without repeated descriptions.

First light flux control member 3400 includes first incident surface 110, depression 111, first emission surface 114, flange 115, bottom surface 116, and total-reflection surface 3401.

Total-reflection surface 3401 constitutes an external surface extending from the outer circumferential portion of bottom surface 116 to the lower surface of flange 115 and is rotationally symmetrical about center axis P1. The total-reflection surface 3401 flares from the external edge of bottom surface 116 toward the first emission surface 114. The external diameter gradually increases from bottom surface 116 to flange 115. Total-reflection surface 3401 forms a convex arc-like curve with a profile line extending outward (away from center axis P1). Total-reflection surface 3401 has roughened portions 3402 that are roughened more than other areas of total-reflection surface 3401 from the connecting portion of bottom surface 116 and total-reflection surface 3401 to the connecting portion of total-reflection surface 3401 and flange 115. A pair of roughened portions 3402 is formed on total-reflection surface 3401. First flux control member 3400 according this embodiment is used in a similar manner as first flux control member 101 of light-emitting device 3100 of illumination apparatus 3200, which is described above. Light that would form distinctly bright areas on the pair of target portions 701 is diffused by the pair of roughed portions 3402 on the total-reflection surface 3401 at which the light is reflected. That is, roughed portions 3402 are disposed on total-reflection surface 3401 intersecting an imaginary plane containing center axis P1 and orthogonal to target surfaces 701a and 701b, which are the incident sides of target portions 701. Roughed portions 3402 are disposed in ranges defined by turning the intersecting line of the imaginary plane and total-reflection surface 3401 around center axis P1, which is the axis of rotation, by $\pm\theta2/2$. Roughed portions 3402 are roughened more than areas of total-reflection surface 3401 defined by turning the intersecting line by ±90° (see FIG. 36C).

First flux control member 3400 having the configuration described above is accommodated in second flux control member 102 illustrated in FIGS. 1A to 6B. In this embodiment, a light-emitting device includes first flux control member 3400 and second flux control member 102 accommodating first flux control member 3400.

In the illumination apparatus including the light-emitting devices described above, the light-emitting devices are disposed such that the pairs of roughened portions 3402 are disposed on the sides of target surface 701*a* and opposing target surface 701*b*, in such a manner similar to that illustrated in FIG. 32. In the illumination apparatus according to this embodiment, the configuration is the same as that illustrated in FIG. 32, except that the light-emitting devices each include first flux control member 3400 and second flux control member 102 accommodating first flux control member 3400. Thus, the description thereon is not repeated.

According to this embodiment, in addition to the advantageous effects of Embodiment 1, the roughened portions formed on part of the total-reflection surface of the first flux control member can reduce the illuminance of the bright areas near the light source of the target portion, which causes variation in illuminance, and the uniform illuminance distribution of the target portion can be achieved.

According to this embodiment, roughened portions are formed on part of the total-reflection surface. Thus, the light from the total-refection surface without the roughed portions can illuminate areas on the target surface and the opposing target surface away from the light source with appropriate intensity.

According to this embodiment, roughened portions are formed by roughening part of the total-reflection surface of the first light flux control member. This embodiment is not limited thereto. Instead, a roughened sheet may be attached to part of the total-reflection surface to form a roughened portion. The roughness of the roughened portions may have a gradation. Part of the total-reflection surface can be roughed by carrying out processing such as etching, electrical discharging, or blasting on a metal mold and transferring this onto the surface of the first light flux control member through molding.

Embodiment 12

Figure 37A:
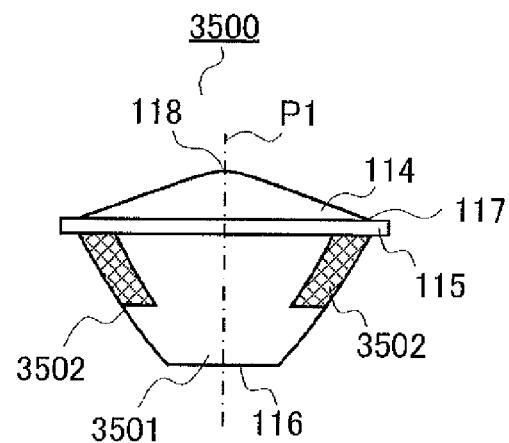
FIG. 37A is a front view of a first light flux control member according to Embodiment 12 of the present invention.
Figure 37B:
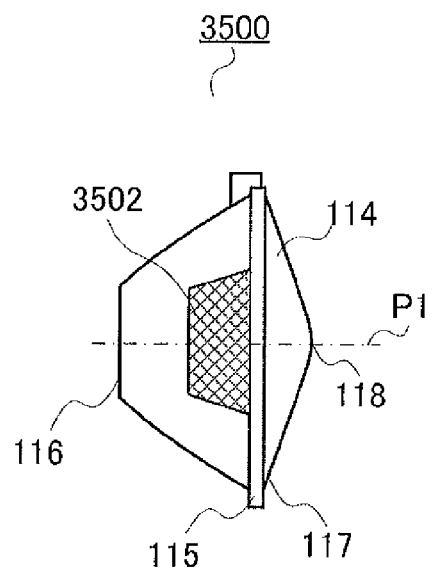
FIG. 37B is a side view of the first light flux control member according to Embodiment 12 of the present invention.
Figure 37C:
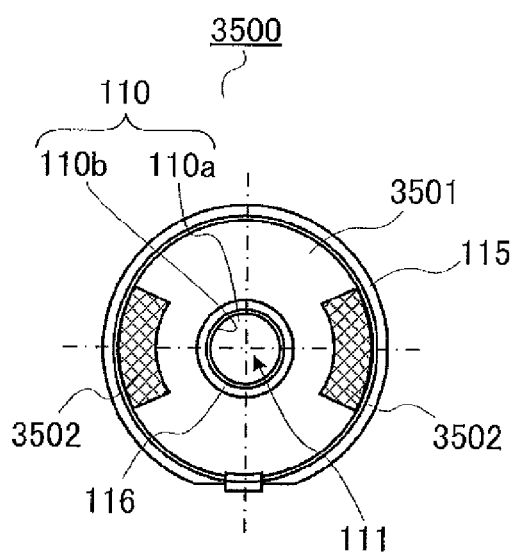
FIG. 37C is a bottom view of the first light flux control member according to Embodiment 12 of the present invention.

The configuration of first light flux control member 3500 will now be described in detail with reference to FIGS. 37A to 37C. FIG. 37A is a front view of first light flux control member 3500 according to Embodiment 12 of the present invention. FIG. 37B is a side view of first light flux control member 3500 according to Embodiment 12 of the present invention. FIG. 37C is a bottom view of first light flux control member 3500 according to Embodiment 12 of the present invention. In FIG. 37, the same elements as those in FIGS. 1A to 6B will be designated by the same reference numerals, without repeated descriptions.

First light flux control member 3500 includes first incident surface 110, depression 111, first emission surface 114, flange 115, bottom surface 116, and total-reflection surface 3501.

Total-reflection surface 3501 constitutes an external surface extending from the outer circumferential portion of bottom surface 116 to the lower surface of flange 115 and is rotationally symmetrical about center axis P1. The total-reflection surface 3501 flares from the external edge of bottom surface 116 toward first emission surface 114. The outer diameter gradually increases from bottom surface 116 to flange 115. Total-reflection surface 3501 forms a convex with a profile line extending outward (away from center axis P1). Total-reflection surface 3501 has roughened portions 3502 that are roughened more than other areas of total-reflection surface 3501 from the connecting portion of total-reflection surface 3501 and flange 115 to the substantially middle portion of flange 115 and bottom surface 116. A pair of roughened portions 3502 is formed on total-reflection surface 3501. First flux control member 3500 according this embodiment is used in a similar manner as first flux control member 101 of light-emitting device 3100 of illumination apparatus 3200, which is described above. Light that would form distinctly bright areas on the pair of target portions 701 is diffused by the pair of roughed portions 3502 on the total-reflection surface 3501 at which the light is reflected. That is, roughed portions 3502 are disposed on total-reflection surface 3501 intersecting an imaginary plane containing center axis P1 and orthogonal to target surfaces 701*a* and 701*b*, which are the incident sides of target portions 701. Roughed portions 3502 are disposed in ranges defined by turning the intersecting line of the imaginary plane and total-reflection surface 3501 around center axis P1, which is the axis of rotation, by ±θ2/2. Roughed portions 3502 are roughened more than areas of total-reflection surface 3501 defined by turning the intersecting line by ±90° (see FIG. 37C).

First flux control member 3500 having the configuration described above is accommodated in second flux control member 102 illustrated in FIGS. 1A to 6B. In this embodiment, a light-emitting device includes first flux control member 3500 and second flux control member 102 accommodating the first flux control member 3500.

In the illumination apparatus including the light-emitting devices described above, the light-emitting devices are disposed such that the pairs of roughened portions 3502 are disposed on the sides of target surface 701*a* and opposing target surface 701*b*, in such a manner similar to that illustrated in FIG. 32. In the illumination apparatus according to this embodiment, the configuration is the same as that illustrated in FIG. 32, except that the light-emitting devices each includes first flux control member 3500 and second flux control member 102 accommodating first flux control member 3500. Thus, the description thereon is not repeated.

According to this embodiment, in addition to the advantageous effects of Embodiment 1, the roughened portions formed on part of the total-reflection surface of the first flux control member can reduce the illuminance of the bright areas near the light source of the target portion, which causes variation in illuminance, and the uniform illuminance distribution of the target portion can be achieved.

According to this embodiment, roughened portions are formed on part of the total-reflection surface. Thus, the light from the total-refection surface without the roughed portions can illuminate areas on the target surface and the opposing target surface away from the light source with appropriate intensity.

According to this embodiment, roughened portions are formed by roughening part of the total-reflection surface of the first light flux control member. This embodiment is not limited thereto. Instead, a roughened sheet may be attached to part of the total-reflection surface to form a roughened portion. The roughness of the roughened portions may have a gradation. Part of the total-reflection surface can be roughed by carrying out processing such as etching, electrical discharging, or blasting on a metal mold and transferring this onto the surface of the first light flux control member through molding.

According to Embodiments 1 to 8, a light-emitting device illuminates a target surface and an opposing target surface. The present invention is not limited thereto. Instead, a light-emitting device may illuminate a single target surface. In such a case, the illuminance of the target surface can be increased by providing reflective plates on the target surface to be illuminated and the opposing target surface.

The second incident surface of the second flux control member according to Embodiments 1 to 8 may receive, in addition to the light that is not incident on the first flux control member, light that is incident on the first flux control member and leaks from the total-reflection surface or other surfaces.

According to Embodiments 1 to 8, a mirror may be provided on part of the incident surface of the second flux control member or flux control portion to reflect the light incident on the incident surface at the mirror toward the emission direction of the light from the first flux control member or the emission surface.

According to Embodiments 9 to 12, diffusion of emission light is not limited at roughened portions according to the embodiments. Instead, the embodiments may be combined appropriately to provide multiple roughened portions at various positions that diffuse light emitted from different areas.

The light-emitting device according to Embodiment 9 to 12 illuminates a target surface and an opposing target surface. The present invention is not limited thereto. Instead, a single target surface may be illuminated. In such a case, a pair of (two) roughened portions is not required, and a single roughened portion may be formed at a position corresponding to the target surface.

One of the target surface and the opposing target surface may be a reflective surface and the other a transmissive surface. In such a case, a roughened portion may be formed at least one of the positions corresponding to the target surface and the opposing target surface depending on the illuminance distribution on the emission side of the transmissive surface.

The entire content disclosed in the descriptions, drawings, and abstract of Japanese Patent Application No. 2010-174783, filed on Aug. 3, 2010, and Japanese Patent Application No. 2010-234966, filed on Oct. 19, 2010, is hereby incorporated by reference.

INDUSTRIAL APPLICABILITY

The light-emitting device and the illumination apparatus according to the present invention is particularly suitable for illuminating a plate surface, a ceiling, a wall surface, a floor surface, a signboard, or other surfaces.

REFERENCE SIGNS LIST 100 light-emitting device
101 first flux control member
102 second flux control member
110 first incident surface
111 depression
113 total-reflection surface
114 first emission surface
115 flange
116 bottom surface
117 outer circumferential portion
118 apex
120 resilient portion
121 fixed portion
126 flux controlling portion
126a second incident surface
126b second emission surface
200 light-emitting element

The invention claimed is:

1. A light-emitting device comprising a light-emitting element and a flux control member that receives light from the light-emitting element and controls a traveling direction of incident light, wherein:
the flux control member and the light-emitting element are disposed such that a center axis of the flux control member aligns with an optical axis of the light-emitting element;
the flux control member comprises:
a first flux control member that receives part of the light from the light-emitting element, controls and emits the incident light in such a way that the emitted light has a predetermined distribution characteristic; and
a second flux control member that receives light from the light-emitting element not incident on the first flux control member, controls and emits the incident light in such a way that the emitted light has a predetermined distribution characteristic;
the first flux control member comprises:
a first incident surface that receives part of the light from the light-emitting element;
a total-reflection surface that reflects part of the light incident on the first incident surface; and
a first emission surface that controls part of the light incident on the first incident surface and the light reflected at the total-reflection surface to have a predetermined distribution characteristic, and emits the controlled light;
the first incident surface is an inner surface of a depression in a bottom surface of the first flux control member;
the total-reflection surface flares from an external edge of the bottom surface to the first emission surface; and
the second flux control member comprises:
a second incident surface that receives light from the light-emitting element, the light being incident in an angular range larger than a maximum angle of the light incident on the first flux control member to the optical axis; and
a second emission surface that controls and emits the light incident on the second incident surface in such a way that the light emitted from the second emission surface has a distribution characteristic different from the distribution characteristic of the light emitted from the first flux control member.

2. The light-emitting device according to claim 1, wherein the second flux control member is cylindrical and accommodates the first flux control member therein.

3. The light-emitting device according to claim 1, wherein at least one of the second emission surface and the second incident surface of the second flux control member is roughened.

4. The light-emitting device according to claim 1, wherein at least one of the second emission surface and the second incident surface of the second flux control member tilts from the optical axis.

5. The light-emitting device according to claim 1, wherein:
the second flux control member includes a top panel that covers part of the first emission surface;
the top panel includes a third incident surface and a third emission surface;
the third incident surface receives light from the first emission surface covered with the third incident surface; and the third emission surface combines the light incident on the third incident surface with the light from the first emission surface.

6. The light-emitting device according to claim 5, wherein the top panel contains at least one of a color correction substance and a scattering material.

7. An illumination apparatus comprising:
the light-emitting device according to claim 5; and
a target surface disposed such that light from the light-emitting device emitted at a small angle from the optical axis has an incident angle larger than light from the light-emitting device emitted at a larger angle from the optical axis.

8. The illumination apparatus according to claim 7, wherein:
a top-panel roughened portion is disposed on part of the circumference of the third emission surface or the third incident surface of the second flux control member;
the top-panel roughened portion is roughened more than other areas of the third emission surface or the third incident surface; and
the top-panel roughened portion is disposed on an intersecting line of the top panel and an imaginary plane, the imaginary plane being orthogonal to the target surface and containing the optical axis.

9. The light-emitting device according to claim 1, wherein the second flux control member contains at least one of a color correction substance and a scattering material.

10. An illumination apparatus comprising:
the light-emitting device according to claim 1; and
a target surface disposed such that light from the light-emitting device emitted at a small angle from the optical axis has an incident angle larger than light from the light-emitting device emitted at a larger angle from the optical axis.

11. The illumination apparatus according to claim 10, wherein:
the first flux control member has a groove-like notch in part of an opening edge of the depression extending to the first incident surface and the total-reflection surface; and
the notch is positioned farthest from the target surface when the first flux control member is rotated around the optical axis serving as a rotating axis.

12. The illumination apparatus according to claim 10, wherein:
in the first flux control member, a first roughened portion is disposed on part of the circumference of the external edge portion of the first emission surface;
the first roughened portion is roughened more than other areas; and
the first roughened portion is disposed on an intersecting line of the first emission surface and an imaginary plane, the imaginary plane being orthogonal to the target surface and containing the optical axis.

13. The illumination apparatus according to claim 10, wherein:
in the first flux control member, a second roughened portion is disposed on part of the circumference of the total-reflection surface;
the second roughened portion is roughened more than other areas; and
the second roughened portion is disposed on an intersecting line of the total-reflection surface and an imaginary plane, the imaginary plane being orthogonal to the target surface and containing the optical axis.

14. The illumination apparatus according to claim 10, further comprising an opposing target surface that opposes the target surface and is illuminated with the light from the light-emitting device.

15. The illumination apparatus according to claim 14, wherein one of the target surface and the opposing target surface comprises a transmissive surface and the other comprises a reflective surface.

16. The illumination apparatus according to claim 10, wherein a plurality of the light-emitting devices are arranged at predetermined intervals.

* * * * *